(12) United States Patent
Takano

(10) Patent No.: US 10,439,587 B2
(45) Date of Patent: Oct. 8, 2019

(54) METHODS OF MANUFACTURING ELECTRONIC DEVICES FORMED IN A CAVITY

(71) Applicant: SKYWORKS SOLUTIONS, INC., Woburn, MA (US)

(72) Inventor: Atsushi Takano, Kadoma (JP)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 119 days.

(21) Appl. No.: 15/828,625

(22) Filed: Dec. 1, 2017

(65) Prior Publication Data
US 2018/0159493 A1 Jun. 7, 2018

Related U.S. Application Data

(60) Provisional application No. 62/539,871, filed on Aug. 1, 2017, provisional application No. 62/539,863, filed
(Continued)

(51) Int. Cl.
*B23K 1/00* (2006.01)
*B23K 20/00* (2006.01)
(Continued)

(52) U.S. Cl.
CPC ......... *H03H 9/1035* (2013.01); *B23K 1/0016* (2013.01); *B23K 20/16* (2013.01); *B23K 26/382* (2015.10); *B23K 26/402* (2013.01); *H01L 21/187* (2013.01); *H01L 24/83* (2013.01); *H01L 25/0657* (2013.01); *H01L 41/313* (2013.01); *H01L 41/337* (2013.01); *H01L 41/338* (2013.01); *H03H 3/02* (2013.01);
(Continued)

(58) Field of Classification Search
CPC .......... H01L 2224/05644; H01L 2224/83825; B23K 1/0016; B23K 2101/40; B23K 35/0222; B23K 35/262; B23K 35/3013; B81C 1/00269; B81C 2203/0109
USPC ....................................... 228/193, 194, 225
See application file for complete search history.

(56) References Cited

U.S. PATENT DOCUMENTS 3,439,231 A 4/1969 Bode
4,973,117 A 11/1990 Yamada
(Continued)

FOREIGN PATENT DOCUMENTS

DE 102012110542 A1 6/2014
JP 2012074612 A 4/2012
JP 2014199852 A 10/2014

*Primary Examiner* — Erin B Saad
(74) *Attorney, Agent, or Firm* — Lando & Anastasi, LLP

(57) ABSTRACT

Methods of manufacturing an electronic device formed in a cavity may include providing a first substrate having a first side wall including a first metal formed along a periphery on a bottom surface thereof and surrounding an electronic circuit disposed on the bottom surface, providing a second substrate having a second side wall including a second metal and a third metal formed along a periphery on a top surface thereof, aligning the first substrate with the second substrate with the first side wall opposing and contacting the second side wall to internally define a cavity between the bottom surface of the first substrate, the top surface of the second substrate, the first side wall ,and the second side wall, and heating and bonding the first substrate and the second substrate by transient liquid phase bonding.

23 Claims, 30 Drawing Sheets

Related U.S. Application Data on Aug. 1, 2017, provisional application No. 62/539,861, filed on Aug. 1, 2017, provisional application No. 62/539,873, filed on Aug. 1, 2017, provisional application No. 62/429,218, filed on Dec. 2, 2016, provisional application No. 62/429,223, filed on Dec. 2, 2016, provisional application No. 62/429,183, filed on Dec. 2, 2016, provisional application No. 62/429,190, filed on Dec. 2, 2016, provisional application No. 62/429,188, filed on Dec. 2, 2016, provisional application No. 62/429,186, filed on Dec. 2, 2016, provisional application No. 62/429,226, filed on Dec. 2, 2016, provisional application No. 62/429,179, filed on Dec. 2, 2016.

(51) Int. Cl.

| | | |
|---|---|---|
| *H03H 9/10* | (2006.01) | |
| *H03H 3/02* | (2006.01) | |
| *H03H 9/17* | (2006.01) | |
| *H03H 9/05* | (2006.01) | |
| *H01L 41/313* | (2013.01) | |
| *H01L 41/338* | (2013.01) | |
| *H01L 23/00* | (2006.01) | |
| *H01L 41/337* | (2013.01) | |
| *B23K 20/16* | (2006.01) | |
| *H01L 21/18* | (2006.01) | |
| *H01L 25/065* | (2006.01) | |
| *B23K 26/402* | (2014.01) | |
| *B23K 26/382* | (2014.01) | |
| *H03H 9/70* | (2006.01) | |
| *B23K 101/36* | (2006.01) | |
| *B23K 101/42* | (2006.01) | |
| *B23K 103/16* | (2006.01) | |

(52) U.S. Cl.

CPC ............ *H03H 9/0523* (2013.01); *H03H 9/17* (2013.01); *H03H 9/171* (2013.01); *H03H 9/173* (2013.01); *H03H 9/175* (2013.01); *B23K 2101/36* (2018.08); *B23K 2101/42* (2018.08); *B23K 2103/172* (2018.08); *H01L 24/94* (2013.01); *H01L 2224/8312* (2013.01); *H01L 2224/83096* (2013.01); *H01L 2224/83825* (2013.01); *H01L 2924/0105* (2013.01); *H01L 2924/01029* (2013.01); *H01L 2924/01049* (2013.01); *H01L 2924/01079* (2013.01); *H03H 9/706* (2013.01); *H03H 2003/021* (2013.01)

(56) References Cited

U.S. PATENT DOCUMENTS

| | | | |
|---|---|---|---|
| 6,578,754 B1 | 6/2003 | Tung | |
| 7,132,721 B2 | 11/2006 | Platt et al. | |
| 7,628,309 B1 | 12/2009 | Eriksen et al. | |
| 9,768,345 B2 * | 9/2017 | Hu | ............ H01L 33/06 |
| 9,773,750 B2 * | 9/2017 | Bibl | ............ H01L 24/83 |
| 10,196,745 B2 * | 2/2019 | Kapusta | ........... C23C 28/023 |
| 2002/0113296 A1 * | 8/2002 | Cho | ............ B81B 7/0077 |
| | | | 257/659 |
| 2004/0041496 A1 | 3/2004 | Imai et al. | |
| 2004/0087043 A1 * | 5/2004 | Lee | ........... B81C 1/00269 |
| | | | 438/6 |
| 2006/0131998 A1 | 6/2006 | Aoki et al. | |
| 2006/0249847 A1 | 11/2006 | Eriksen et al. | |
| 2007/0058003 A1 * | 3/2007 | Aoki | ............ H03H 9/0547 |
| | | | 347/68 |
| 2009/0004500 A1 | 1/2009 | Suh et al. | |
| 2009/0203163 A1 | 8/2009 | Eriksen et al. | |
| 2010/0244161 A1 | 9/2010 | Tabrizi | |
| 2010/0308697 A1 | 12/2010 | Aratake et al. | |
| 2011/0114355 A1 | 5/2011 | Bauer et al. | |
| 2011/0220704 A1 | 9/2011 | Liu et al. | |
| 2012/0112201 A1 | 5/2012 | Otsuka et al. | |
| 2013/0001782 A1 | 1/2013 | Otsuka et al. | |
| 2015/0008253 A1 | 1/2015 | Yoon et al. | |
| 2015/0102510 A1 | 4/2015 | Kaneda et al. | |
| 2015/0123744 A1 * | 5/2015 | Nishimura | ............ H03H 9/059 |
| | | | 333/133 |
| 2016/0037649 A1 | 2/2016 | Barber | |
| 2016/0365843 A1 | 12/2016 | Martin et al. | |
| 2017/0086320 A1 | 3/2017 | Barber | |
| 2017/0232562 A1 | 8/2017 | Maeno | |

* cited by examiner

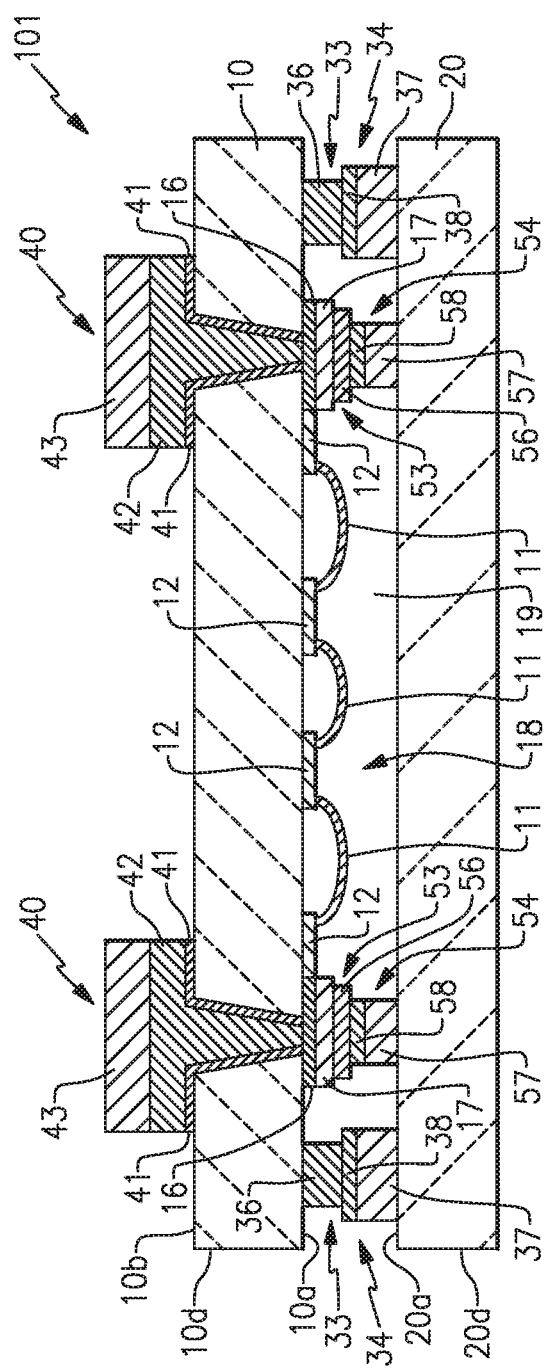

METHODS OF MANUFACTURING ELECTRONIC DEVICES FORMED IN A CAVITY

CROSS-REFERENCE TO RELATED APPLICATIONS

This application claims priority under 35 U.S.C. § 119(e) to each of U.S. Provisional Patent Application Ser. No. 62/429,218, titled "METHODS OF MANUFACTURING ELECTRONIC DEVICES FORMED IN A CAVITY HAVING REDUCED INSERTION LOSS," filed Dec. 2, 2016, U.S. Provisional Patent Application Ser. No. 62/429,223, titled "METHODS OF MANUFACTURING ELECTRONIC DEVICES TO PREVENT WATER INGRESS DURING MANUFACTURE," filed Dec. 2, 2016, U.S. Provisional Patent Application Ser. No. 62/539,863, titled "METHODS OF MANUFACTURING ELECTRONIC DEVICES TO PREVENT WATER INGRESS DURING MANUFACTURE," filed Aug. 1, 2017, U.S. Provisional Patent Application Ser. No. 62/429,226, titled "METHODS OF MANUFACTURING ELECTRONIC DEVICES TO PREVENT DAMAGE DURING DICING," filed Dec. 2, 2016, U.S. Provisional Patent Application Ser. No. 62/429,179, titled "METHODS OF MANUFACTURING ELECTRONIC DEVICES FORMED IN A CAVITY," filed Dec. 2, 2016, U.S. Provisional Patent Application Ser. No. 62/539,861, titled "METHODS OF MANUFACTURING ELECTRONIC DEVICES FORMED IN A CAVITY," filed Aug. 1, 2017, U.S. Provisional Patent Application Ser. No. 62/429,183, titled "ELECTRONIC DEVICES FORMED IN A CAVITY BETWEEN SUBSTRATES," filed Dec. 2, 2016, U.S. Provisional Patent Application Ser. No. 62/429,186, titled "METHODS OF MANUFACTURING ELECTRONIC DEVICES FORMED IN A CAVITY AND INCLUDING A VIA," filed Dec. 2, 2016, U.S. Provisional Patent Application Ser. No. 62/539,871, titled "METHODS OF MANUFACTURING ELECTRONIC DEVICES FORMED INA CAVITY AND INCLUDING A VIA," filed Aug. 1, 2017, U.S. Provisional Patent Application Ser. No. 62/429,188, titled "ELECTRONIC DEVICES FORMED IN A CAVITY BETWEEN SUBSTRATES AND INCLUDING A VIA," filed Dec. 2, 2016, U.S. Provisional Patent Application Ser. No. 62/539,873, titled "ELECTRONIC DEVICES FORMED IN A CAVITY BETWEEN SUBSTRATES AND INCLUDING A VIA," filed Aug. 1, 2017, and U.S. Provisional Patent Application Ser. No. 62/429,190, titled "ELECTRONIC DEVICES FORMED IN A VACUUM SEALED CAVITY," filed Dec. 2, 2016. Each of these applications is incorporated by reference herein in its entirety for all purposes.

BACKGROUND

Conventionally, in communication devices such as mobile phones, filter devices are used to separate signals having different bands such as a transmission signal and a reception signal. Electronic devices including bulk acoustic wave (BAW) resonators, such as a film bulk acoustic resonators (FBAR) and solidly mounted resonators (SMRs), have been used in filter devices. Such electronic devices may include a device substrate on which an electronic circuit is disposed and a cap substrate. Such electronic devices may be manufactured as follows: portions to be bonded between the device substrate and the cap substrate are formed with the same types of metals such as gold or copper; the metal portions are covalently bonded with each other at high temperature and high pressure; and then the device substrate and the cap substrate are bonded together.

Background material describing FBAR filters and Surface Acoustic Wave (SAW) filters includes "Development of FBAR Filters: In Comparison with SAW Filters," Transactions of Institute of Electronics, Information and Communication Engineers, Electronic Device, 103(728), 9-14, 2004 Mar. 9.

SUMMARY OF INVENTION

Aspects and embodiments disclosed herein relate to electronic devices, such as filters, that are formed in a cavity between substrates and include a via, and methods of manufacturing same.

Some conventional methods of fabricating electronic devices include gold-gold bonding or copper-copper bonding that require a high temperature and pressure process that may cause the device substrate, the cap substrate, and the like to be damaged and the manufacturing yield to be lowered. These conventional processes may include repeated cycles between a normal temperature and pressure step and a high temperature and pressure step, which may cause the cycle time to be unnecessarily elongated. Still further, in these conventional processes defects may occur due to overetching in a process of forming a through-hole, lowering the manufacturing yield.

Aspects of the present disclosure provide an electronic device and a method of manufacturing the electronic device that may be used to improve the yield, shorten the cycle time, prevent defects occurring due to overetching in a process of forming a through-hole, or all of the above.

A method of manufacturing an electronic device according to certain embodiments may include providing a first substrate having a first side wall of a certain height formed along a periphery of a bottom surface of the first substrate, the first side wall surrounding an electronic circuit disposed on the bottom surface, the first side wall being formed by a first metal layer made of a first metal, providing a second substrate having a second side wall of a certain height formed along a periphery on a top surface of the second substrate, the second side wall being formed by a second metal layer made of a second metal and a third metal layer made of a third metal stacked sequentially, aligning the first substrate with the second substrate to internally define a cavity between the bottom surface of the first substrate, the top surface of the second substrate, the first side wall and the second side wall, the first side wall opposing and contacting the second side wall, and heating the first substrate and the second substrate to bond the first side wall and the second side wall with each other, the first metal layer, the second metal layer, and the third metal layer being heated to form alloy layers by transient liquid phase bonding. The first substrate may be made of a piezoelectric body. The electronic circuit may include at least one of a film bulk acoustic resonator, a bulk acoustic wave element, and a surface acoustic wave element.

The third metal may have a melting point lower than that of the second metal. The third metal may be different from the second metal. Heating the first substrate and the second substrate may include melting the third metal layer and forming a first alloy layer and a second alloy layer with the first metal layer and the second metal layer, respectively. The third metal layer may be consumed when the first alloy layer and the second alloy layer are formed.

The second side wall may have a height greater than that of the first side wall. A starting temperature of alloy forming between the third metal layer and the second metal layer may be lower than that of alloy forming between the third metal layer and the first metal layer. There may be no state where the first metal, the second metal, and the third metal are melted together during the transient liquid phase bonding. The first substrate may have a thickness different from that of the second substrate.

The first metal may include gold (Au). The second metal may include copper (Cu). The third metal may include at least one of tin (Sn) and indium (In).

According to certain embodiments, the method of manufacturing the electronic device may further include providing a printed circuit board, the first substrate and the second substrate bonded with each other by the first side wall and the second side wall being mounted on a top surface of the printed circuit board, the top surface of the printed circuit board on which the first substrate and the second substrate are mounted being covered and sealed by resin including fillers having respective certain diameters, the first side wall and the second side wall being internally withdrawn from respective peripheries of the first substrate and the second substrate by a certain distance that is half or less of an average diameter of the fillers.

According to certain embodiments, an electronic device may include a first substrate having a first side wall of a certain height formed along a periphery of a bottom surface of the first substrate, the first side wall surrounding an electronic circuit disposed on the bottom surface, and a second substrate having a second side wall of a certain height formed along a periphery of a top surface of the second substrate, the second side wall being aligned and bonded with the first side wall such that the first side wall opposes and contacts the second side wall to internally form a cavity defined between the bottom surface of the first substrate, the top surface of the second substrate, the first side wall and the second side wall, the first side wall being bonded with the second side wall by transient liquid phase bonding.

According to certain embodiments, an electronic device may include a first substrate having a bottom surface and a top surface, a first side wall of a certain height being formed along a periphery of the bottom surface to surround an electronic circuit disposed on the bottom surface, an external electrode being formed on the top surface, the external electrode being connected to the electronic circuit by a via communicating with the bottom surface, and a second substrate having a second side wall of a certain height formed along a periphery of a top surface, the second side wall being aligned and bonded with the first side wall to internally form a cavity defined between the bottom surface of the first substrate, the top surface of the second substrate, the first side wall and the second side wall.

The external electrode may be disposed directly above the via. The first substrate may have a thickness less than that of the second substrate. The top surface of the first substrate may have a surface roughness greater than that of the bottom surface of the first substrate. The side surface of the via may have a surface roughness greater than that of the top surface of the first substrate. The first substrate may have a portion defining the cavity that is thicker than a periphery portion.

According to certain embodiments, a method of manufacturing an electronic device may include forming a first side wall of a certain height along a periphery of a bottom surface of a first substrate having a bottom surface and a top surface to surround an electronic circuit disposed on the bottom surface, forming a via communicating between the bottom surface and the top surface, forming the via including stacking a first stop layer and a second stop layer sequentially on a portion of the bottom surface of the first substrate corresponding to the via and etching the first substrate to form a through-hole corresponding to the via, a rate of etching the first substrate being greater than that of the first stop layer and a rate of etching the first stop layer being greater than that of the second stop layer, forming a second side wall of a certain height along a periphery of a top surface of the second substrate, and aligning and bonding the first side wall and the second side wall to internally define a cavity between the bottom surface of the first substrate, the top surface of the second substrate, the first side wall, and the second side wall.

An external electrode connected to the via may be disposed on the top surface of the first substrate. The etching of the first substrate may be performed by dry etching. The first stop layer may include at least one of titanium (Ti) and chromium (Cr) and the second stop layer may include gold (Au). The second stop layer may have a thickness greater than that of the first stop layer. The electronic circuit may include a wiring pad and the first stop layer and the second stop layer may be formed to be extended over the wiring pad.

According to certain embodiments, a method of manufacturing an electronic device may include providing a first substrate having a bottom surface and a top surface, a first side wall of a certain height being formed along a periphery of the bottom surface of the first substrate to surround an electronic circuit disposed on the bottom surface, a via being formed to communicate between the bottom surface and the top surface, a first column of a certain height having a diameter greater than that of the via being disposed directly under the via on the bottom surface, the first side wall and the first column being formed by a first metal layer made of first metal, providing a second substrate having a top surface upon which a second side wall of a certain height is formed along a periphery of the top surface of the second substrate, a second column of a certain height being formed on the top surface at a position corresponding to the first column formed on the bottom surface of the first substrate, the second side wall and the second column being formed by a second metal layer made of second metal and a third metal layer made of third metal sequentially stacked, aligning the first side wall with the second side wall such that the first side wall opposes and contacts the second side wall to internally define a cavity between the bottom surface of the first substrate, the top surface of the second substrate, the first side wall and the second side wall, and the first column opposes and contacts the second column, and heating the first substrate and the second substrate such that the first column and the second column are melted and bonded with each other, the first metal layer, the second metal layer, and the third metal layer being heated and formed into alloy layers by transient liquid phase bonding.

In certain embodiments, an electronic device may include a first substrate having a bottom surface and a top surface, a first side wall of a certain height being formed along a periphery of the bottom surface of the first substrate to surround an electronic circuit disposed on the bottom surface, a via being formed to communicate between the bottom surface and the top surface, a first column of a certain height having a diameter greater than that of the via being disposed directly under the via on the bottom surface, and a second substrate having a top surface upon which a second side wall of a certain height is formed along a periphery of the top surface of the second substrate, a second column of a certain height being formed on the top surface at a position corresponding to the first column formed on the bottom surface of the first substrate, the second side wall and the second column being aligned and bonded with the first side wall and the first column such that the first side wall opposes and contacts the second side wall and a cavity is internally defined between the bottom surface of the first substrate, the top surface of the second substrate, the first side wall and the second side wall, the first side wall and the first column being bonded with the second side wall and the second column, respectively, by transient liquid phase bonding.

The piezoelectric body may include at least one of lithium tantalate and lithium niobate. The via may include a through-hole formed by dry etching. An external electrode connected to the via may be further disposed on the top surface of the first substrate. The first column may have a diameter greater than that of the second column. Another electronic circuit may be disposed on the top surface of the second substrate and the second side wall may be formed to surround the other electronic circuit. The second substrate may be made of a piezoelectric body. The electronic circuit disposed on the top surface of the second substrate may include at least one of a film bulk acoustic resonator, a bulk acoustic wave element, and a surface acoustic wave element.

According to certain embodiments, an electronic device may include a first substrate having a first side wall of a certain height formed along a periphery of a bottom surface of the first substrate, the first side wall surrounding an electronic circuit disposed on the bottom surface, and a second substrate having a second side wall of a certain height formed along a periphery of a top surface of the second substrate, the second side wall being aligned and bonded with the first side wall to internally define a cavity between the bottom surface of the first substrate, the top surface of the second substrate, the first side wall, and the second side wall, the cavity including an atmosphere having a pressure lower than one atmospheric pressure.

In certain embodiments, a method of manufacturing an electronic device may include providing a first substrate having a first side wall of a certain height formed along a periphery of a bottom surface of the first substrate, the first side wall surrounding an electronic circuit disposed on the bottom surface, providing a second substrate having a second side wall of a certain height formed along a periphery of a flat top surface of the second substrate, aligning the first substrate with the second substrate to internally define a cavity by the bottom surface of the first substrate, the top surface of the second substrate, the first side wall, and the second side wall, the first side wall opposing and contacting the second side wall, and heating the first substrate and the second substrate for the first side wall and the second side wall to be bonded with each other, the heating being performed under vacuum.

The degree of vacuum during the heating may be controlled by a control valve. The first substrate and the second substrate may be preheated at a temperature of 100° C. or less under atmospheric pressure prior to the heating.

According to certain embodiments, a method of manufacturing an electronic device may include forming a first side wall of a certain height along a periphery of a bottom surface of a first substrate having a bottom surface and a top surface to surround an electronic circuit disposed on the bottom surface, forming a via communicating between the bottom surface and the top surface and an external electrode on the top surface, and aligning and bonding the first side wall and the second side wall to internally define a cavity between the bottom surface of the first substrate, the top surface of the second substrate, the first side wall, and the second side wall, the forming the via and the external electrode including forming a through-hole in the first substrate corresponding to the via, forming a sputtered film on the top surface of the first substrate, forming a pattern corresponding to the external electrode over the sputtered film by photolithography, and forming the via and the external electrode simultaneously by plating and filling metal into the through-hole. A negative-type liquid resist can be used for the photolithography.

According to certain embodiments, a method of manufacturing an electronic device may be provided, the electronic device including a first substrate having a first side wall of a certain height formed along a periphery to surround an electronic circuit disposed on a bottom surface of the first substrate, the first side wall being formed on a bottom surface of a first wafer as the bottom surface of the first substrate and a first sealing portion of a certain height being formed along the periphery, and a second substrate having a second side wall of a certain height formed along a periphery on a top surface of the second substrate, the second side wall being aligned and bonded with the first side wall to internally define a cavity between the bottom surface of the first substrate, the top surface of the second substrate, the first side wall, and the second side wall. The method may include forming the first side wall on a bottom surface of a first wafer as the bottom surface of the first substrate and forming a first sealing portion of a certain height along a periphery, forming the second side wall on a top surface of a second wafer as the top surface of the second substrate and forming a second sealing portion of a certain height along the periphery, and aligning and bonding the first wafer and the second wafer with each other to internally define a cavity between the bottom surface of the first wafer, the top surface of the second wafer, the first sealing portion, and the second sealing portion, the first sealing portion and the first side wall being bonded with the second sealing portion and the second side wall, respectively, by transient liquid phase bonding.

The first wafer and the second wafer may be substantially circular-shaped, respectively. The method may further include trimming outer edges of the first sealing portion and the second sealing portion in the first wafer and the second wafer. The trimming may allow the first sealing portion and/or the second sealing portion to be exposed on the peripheries of the first wafer and the second wafer. The trimming may form, in the first wafer and the second wafer, a sealing portion having a certain angle with respect to the bottom surface of the first wafer or the top surface of the second wafer. The top surface of the first wafer and the bottom surface of the second wafer may be ground to certain depths, respectively. The electronic device may be formed by dicing the first wafer and the second wafer into pieces. The first side wall and the second side wall as well as the first sealing portion and the second sealing portion may respectively include a first alloy layer and a second alloy layer bonded by transient liquid phase bonding.

According to certain embodiments, a method of manufacturing an electronic device is provided, the electronic device including a first substrate having a first side wall of a certain height formed along a periphery to surround an electronic circuit disposed on a bottom surface of the first substrate and a second substrate having a second side wall of a certain height formed along a periphery of a top surface of the second substrate, the second side wall being aligned and bonded by transient liquid phase bonding with the first side wall to internally define a cavity between the bottom surface of the first substrate, the top surface of the second substrate, the first side wall, and the second side wall. The method may include forming the first side wall on a bottom surface of a first wafer as the bottom surface of the first substrate and forming a first sealing portion of a certain height along a periphery, forming the second side wall on a top surface of a second wafer as the top surface of the second substrate, and forming a second sealing portion of a certain height along a periphery, aligning and bonding the first wafer and the second wafer with each other to internally define a cavity between the bottom surface of the first wafer, the top surface of the second wafer, the first sealing portion, and the second sealing portion, forming a sealing portion between the bottom surface of the first wafer and the top surface of the second wafer along the peripheries of the first wafer and the second wafer by bonding the first sealing portion with the second sealing portion, and suitably separating the first wafer and the second wafer in an inside region defined by the sealing portion into pieces using plasma. The sealing portion may be ring-shaped.

According to aspects and embodiments described herein, transient liquid phase bonding is used and no high temperature and pressure process may be necessary to bond the device substrate and the cap substrate of an electronic device with each other. Therefore, the cycle time for manufacturing an electronic device may be reduced. Furthermore, a defect occurring due to overetching in a process of forming a through-hole can be prevented and thus the yield can be improved.

According to certain embodiments, a method of manufacturing an electronic device may include providing a first substrate having a first side wall formed along a periphery of a bottom surface of the first substrate, the first side wall surrounding an electronic circuit disposed on the bottom surface of the first substrate, the first side wall being formed of a first metal layer made of a first metal, providing a second substrate having a second side wall formed along a periphery of a top surface of the second substrate, the second side wall being formed of a second metal layer made of a second metal and a third metal layer made of a third metal sequentially stacked, the second metal and the third metal being different from each other and from the first metal, aligning the first substrate with the second substrate to internally define a cavity between the bottom surface of the first substrate, the top surface of the second substrate, the first side wall, and the second side wall, the first side wall opposing and contacting the second side wall, and heating the first substrate and the second substrate to bond the first side wall and the second side wall with each other by transient liquid phase bonding, the third metal layer being melted to form a first alloy layer and a second alloy layer with the first metal layer and the second metal layer respectively.

According to certain embodiments, a method of manufacturing an electronic device may include forming a first side wall along a periphery of a bottom surface of a first substrate and surrounding an electronic circuit disposed on the bottom surface of the first substrate, forming a via communicating between the bottom surface of the first substrate and a top surface of the first substrate, forming the via including stacking a first stop layer and a second stop layer sequentially on a portion of the bottom surface of the first substrate corresponding to the via and etching the first substrate to form a through-hole corresponding to the via, a rate of etching the first substrate being greater than that of the first stop layer and a rate of etching the first stop layer being greater than that of the second stop layer, forming a second side wall along a periphery on a top surface of a second substrate, and aligning and bonding the first side wall and the second side wall to internally define a cavity between the bottom surface of the first substrate, the top surface of the second substrate, the first side wall, and the second side wall.

According to certain embodiments a method of manufacturing an electronic device including a first substrate having a first side wall formed along a periphery of the first substrate and surrounding an electronic circuit disposed on a bottom surface of the first substrate and a second substrate having a second side wall formed along a periphery on a top surface of the second substrate, the second side wall being aligned and bonded with the first side wall to internally define a cavity between the bottom surface of the first substrate, the top surface of the second substrate, the first side wall, and the second side wall may include forming the first side wall on a bottom surface of a first wafer as the bottom surface of the first substrate and forming a first sealing portion about a periphery of the bottom surface of the first wafer, forming the second side wall on a top surface of a second wafer as the top surface of the second substrate and forming a second sealing portion about a periphery of the top surface of the second wafer and aligning and bonding the first wafer and the second wafer with each other to internally define a cavity between the bottom surface of the first wafer, the top surface of the second wafer, the first sealing portion, and the second sealing portion, the first sealing portion and the first side wall being bonded with the second sealing portion and the second side wall respectively by transient liquid phase bonding.

In accordance with certain embodiments, an electronic device may include a first substrate having a first side wall formed along a periphery of a bottom surface of the first substrate and surrounding an electronic circuit disposed on the bottom surface of the first substrate, an external electrode being formed on a top surface of the first substrate, the external electrode being connected to the electronic circuit by a via communicating with the bottom surface of the first substrate, and a second substrate having a second side wall formed along a periphery of a top surface of the second substrate, the second side wall being aligned and bonded with the first side wall to internally define a cavity between the bottom surface of the first substrate, the top surface of the second substrate, the first side wall, and the second side wall, the first side wall including a first alloy of a first metal and a third metal, the second side wall including a second alloy of a second metal and the third metal, the first metal being different from the second metal and from the third metal.

BRIEF DESCRIPTION OF DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 3 is a cross-sectional view showing an alignment between a first substrate and a second substrate;

DETAILED DESCRIPTION

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Figure 1:
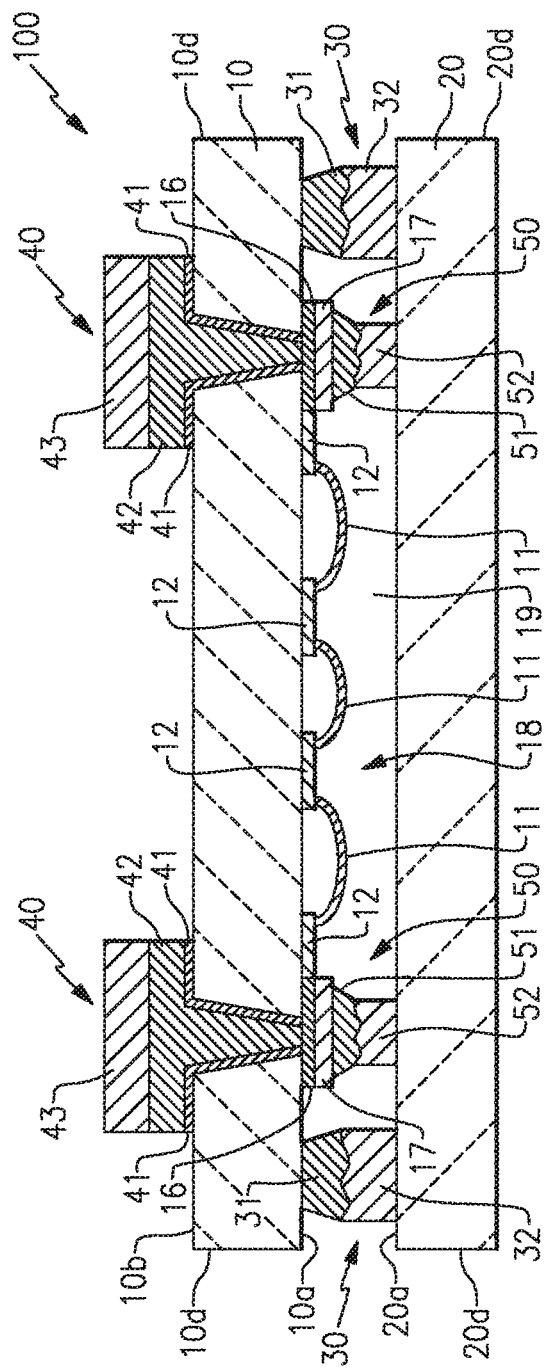
FIG. 1 is a cross-sectional view showing a schematic configuration of an electronic device according to an embodiment.
Figure 2:
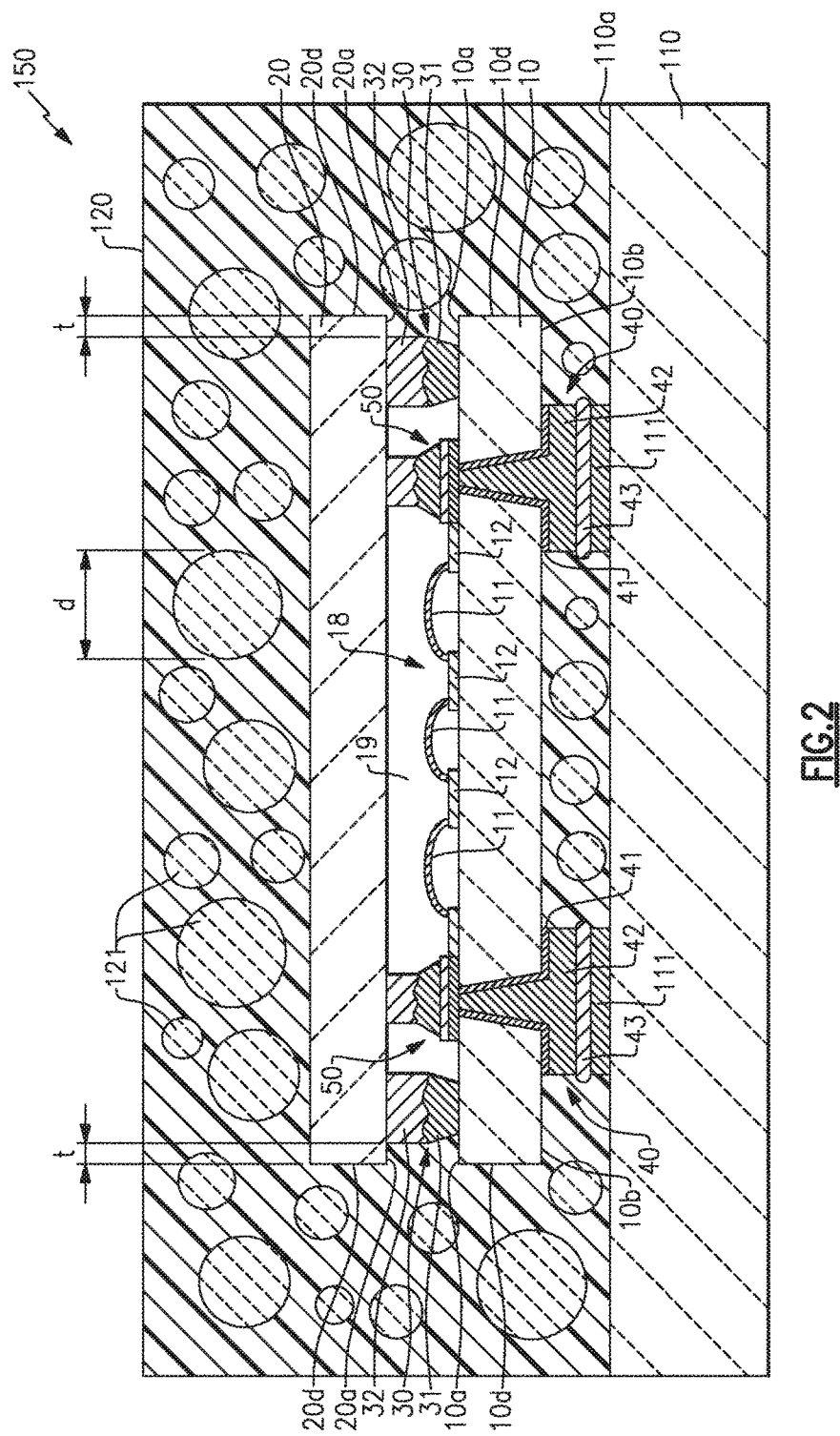
FIG. 2 is a cross-sectional view showing a structure in which an electronic device in accordance with embodiments described herein is implemented on a printed circuit board.

An electronic device and a method of manufacturing the same according to aspects of the present disclosure will be described below in detail with reference to the drawings. FIG. 1 is a cross-sectional view showing a schematic configuration of an electronic device according to an embodiment. FIG. 2 is a cross-sectional view showing a structure in which an electronic device in accordance with an embodiment is implemented on a printed circuit board.

As shown in FIG. 1, according to an embodiment, an electronic device 100 includes a first substrate 10 having a certain thickness and a second substrate 20 having a certain thickness and opposing the first substrate 10 with a certain gap. The first substrate 10 may be referred to as a device substrate. A bottom surface 10a of the first substrate 10 opposes the second substrate 20 and is provided with an electronic circuit 18 including a film bulk acoustic resonator (FBAR) 11. The second substrate 20 may be referred to as a cap substrate. A side wall 30 is formed to define a certain gap between a top surface 20a of the second substrate 20 and a bottom surface 10a of the first substrate 10. The bottom surface 10a of the first substrate 10, the top surface 20a of the second substrate 20, and the side wall 30 define a cavity 19, in which the electronic circuit 18 disposed on the bottom surface 10a of the first substrate 10 is internally included.

Referring to FIG. 2 showing a structure 150 in which an electronic device 100 is implemented on a printed circuit board 110, the electronic device 100 of FIG. 1 is now disposed upside down on a top surface 110a of the printed circuit board 110. A resin layer 120 is disposed on the top surface 110a of the printed circuit board 110 to cover the electronic device 100. In the structure 150, the second substrate 20 acts as a cap to support the resin layer 120 above the electronic device 100 and protect the cavity 19.

In particular, the first substrate 10 is made of a piezoelectric body such as aluminum nitride (AlN) and zinc oxide (ZnO). A plurality of film bulk acoustic resonators 11 are formed by thin films of the piezoelectric body on the bottom surface 10a of the first substrate 10. The film bulk acoustic resonators 11 are suitably connected to each other by wiring pads 12 to form an electronic circuit 18 such as a filter and a filter device. It is to be appreciated that, although the electronic circuit 18 includes film bulk acoustic resonators 11, a surface acoustic wave (SAW) element or a bulk acoustic wave (BAW) element such as a solidly mounted resonator (SMR) can be used in addition to or instead of the film bulk acoustic resonators 11.

The second substrate 20 is made of, for example, silicon or similar material. The second substrate 20 is supported by the side wall 30 on the first substrate 10 such that the bottom surface 10a of the first substrate 10 and the top surface 20a of the second substrate 20 are separated via a certain gap. The side wall 30 is formed to surround the electronic circuit 18 disposed on the bottom surface 10a of the first substrate 10 and to extend along a periphery 10d of the first substrate 10 and a periphery 20d of the second substrate 20. The side wall 30 includes a first alloy layer 31 made of an alloy of gold (Au) and tin (Sn) and a second alloy layer 32 made of an alloy of tin (Sn) and copper (Cu) and stacked on the first alloy layer 31 between the bottom surface 10a of the first substrate 10 and the top surface 20a of the second substrate 20.

FIG. 3 is a cross-sectional view showing an alignment between the first substrate 10 and the second substrate 20. The cross-sectional view shows a state prior to bonding the first substrate 10 with the second substrate 20 by the side wall 30. A first side wall 33 is disposed on the bottom surface 10a of the first substrate 10 and along the periphery 10d thereof, whereas a second side wall 34 is disposed on the top surface 20a of the second substrate 20 and along the periphery 20d thereof. The first side wall 33 has a certain height and is disposed to be inwardly withdrawn from the periphery 10d of the first substrate 10 by a certain distance. The first side wall 33 is formed by a first metal layer 36 having a first thickness and made of gold (Au) as the first metal. The second side wall 34 has a certain height and is disposed to be inwardly withdrawn from the periphery 20d of the second substrate 20 by a certain distance. The second side wall 34 is formed by a second metal layer 37 having a second thickness and made of copper (Cu) as the second metal and a third metal layer 38 having a third thickness and made of tin (Sn) as the third metal, the third metal layer 38 being stacked on the second metal layer 37. Here, a width of the first side wall 33 is less than that of the second side wall 34.

The first substrate 10 is aligned with the second substrate 20 such that the bottom surface 10a of the first substrate 10, the top surface 20a of the second substrate 20, the first side wall 33, and the second side wall 34 can internally define a cavity 19 and the first side wall 33 can oppose and contact the second side wall 34. Thus, the bottom surface of the first side wall 33 abuts onto the top surface of the second side wall 34. According to an aspect of the present disclosure, the first substrate 10 and the second substrate 20 are maintained in the aligned state and heated such that the first side wall 33 and the second side wall 34 are bonded with each other by transient liquid phase (TLP) bonding into a single side wall 30.

Figure 4A:
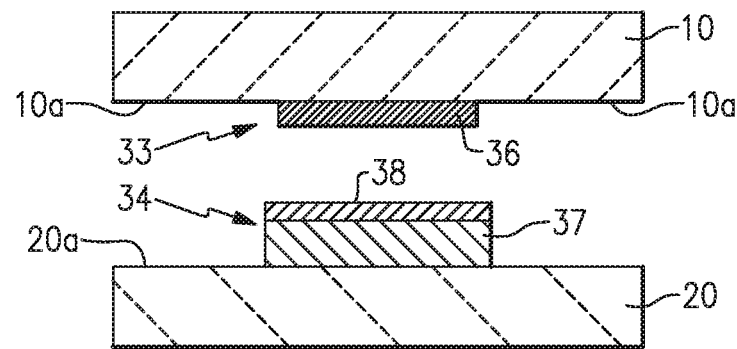
FIGS. 4A-4C are cross-sectional views illustrating a transient liquid phase bonding.
Figure 4B:
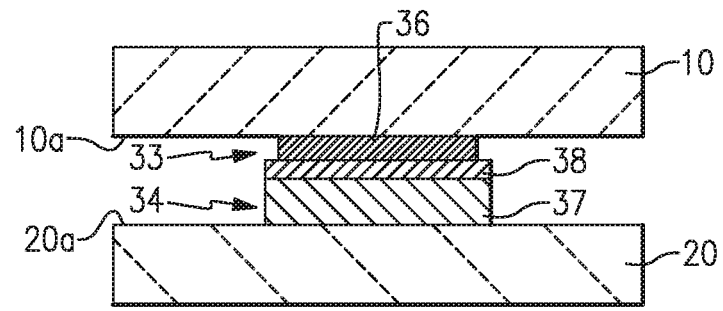
Figure 4C:
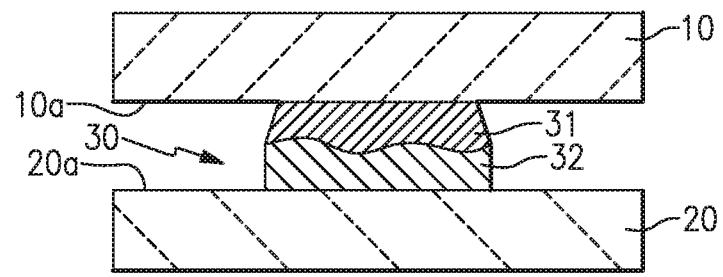

FIGS. 4A-4C are partially enlarged cross-sectional views illustrating the TLP bonding. FIGS. 4A-4C specifically show a portion including the first side wall 33 and the second side wall 34 in the first substrate 10 and the second substrate 20 shown in FIG. 3. FIG. 4A shows the first substrate 10 and the second substrate 20 before the alignment. The first metal layer 36 having a first thickness and made of gold (Au) as the first metal is disposed on the bottom surface 10a of the first substrate 10 to form the first side wall 33. The second metal layer 37 having a second thickness and made of copper (Cu) as the second metal is disposed on the top surface 20a of the second substrate 20 and the third metal layer 38 having a third thickness and made of tin (Sn) as the third metal is stacked on the second metal layer 37 to form the second side wall 34 therewith. FIG. 4B shows the first substrate 10 and the second substrate 20 being aligned with each other to allow the bottom surface of the first side wall 33 to oppose and contact the top surface of the second side wall 34. Thus, the bottom surface of the first side wall 33 abuts onto the top surface of the second side wall 34.

According to an aspect of the present disclosure, the first side wall 33 and the second side wall 34 are heated with the bottom surface of the first side wall 33 contacting the top surface of the second side wall 34 as shown in FIG. 4B, and are thus bonded with each other by TLP bonding to form a side wall 30 consisting of a first alloy layer 31 and a second alloy layer 32. This heating process is performed while the first substrate 10 and the second substrate 20 are maintained in a low pressure atmosphere at temperatures ranging from 240° C. to 260° C. over five to ten minutes. The process produces a first alloy layer 31 made of a first alloy of gold and tin, which originate from the gold as the first metal of the first metal layer 36 of the first side wall 33 and the tin as the third metal of the third metal layer 38 of the second side wall 34. The process also produces a second alloy layer 32 made of a second alloy of copper and tin, which originate from the copper as the second metal of the second metal layer 37 and the tin as the third metal of the third metal layer 38 of the second side wall 34.

FIG. 4C shows a state of the first side wall 33 and the second side wall 34 bonded with each other by TLP bonding. The first side wall 33 and the second side wall 34 are bonded by TLP bonding such that the first alloy layer 31 and the second alloy layer 32 are sequentially stacked between the bottom surface 10a of the first substrate 10 and the top surface 20a of the second substrate 20. The first alloy layer 31 is made of first alloy of gold and tin, which originate from the gold as the first metal of the first metal layer 36 and the tin as the third metal of the third metal layer 38. The second alloy layer 32 is made of a second alloy of copper and tin, which originate from the copper as the second metal of the second metal layer 37 and the tin as the third metal of the third metal layer 38.

According to an aspect of the present disclosure, the third metal of the third metal layer 38 forming the second side wall 34 has a melting point lower than that of the second metal of the second metal layer 37. In fact, tin as the third metal has a melting point lower than that of copper as the second metal. As such, allowing the third metal to have a melting point lower than that of the second metal may bond the first side wall 33 with the second side wall 34 at a lower temperature and for a shorter time. Here, the bonding at a lower temperature prevents machining strain and the like internally accumulated in the first substrate 10 and the second substrate 20 from becoming undesirably high such that the bonding can be stably performed. Furthermore, the bonding may be performed for a shorter time to improve the productivity.

In addition, according to the present disclosure, the second metal of the second metal layer 37 is different from the third metal of the third metal layer 38 in the second side wall 34. The second metal may be copper whereas the third metal may be tin. Thus, the second side wall 34 is configured to be made of different metals such that the second metal layer 37 and the third metal layer 38 are made of a second metal and a third metal respectively, and accordingly the alloy formation starting temperature and the alloy formation rate are different between the second metal layer 37 and the third metal layer 38. Consequently, the third metal of the third metal layer 38 can be prevented from flowing out due to its melting point being lower than that of the second metal of the second metal layer 37.

Furthermore, according to aspects of the present disclosure, and as shown in FIGS. 4A and 4B, the width of the first side wall 33 formed by the first metal layer 36 of gold as the first metal is configured to be less than that of the second side wall 34 formed by the second metal layer 37 of copper as the second metal and the third metal layer 38 of tin as the third metal. Accordingly, a lesser amount of expensive gold as the first metal may be used in the first metal layer 36 of the first side wall 33 and the greater width of the second side wall 34 may ensure the strength of the side wall 30.

Figure 5A:
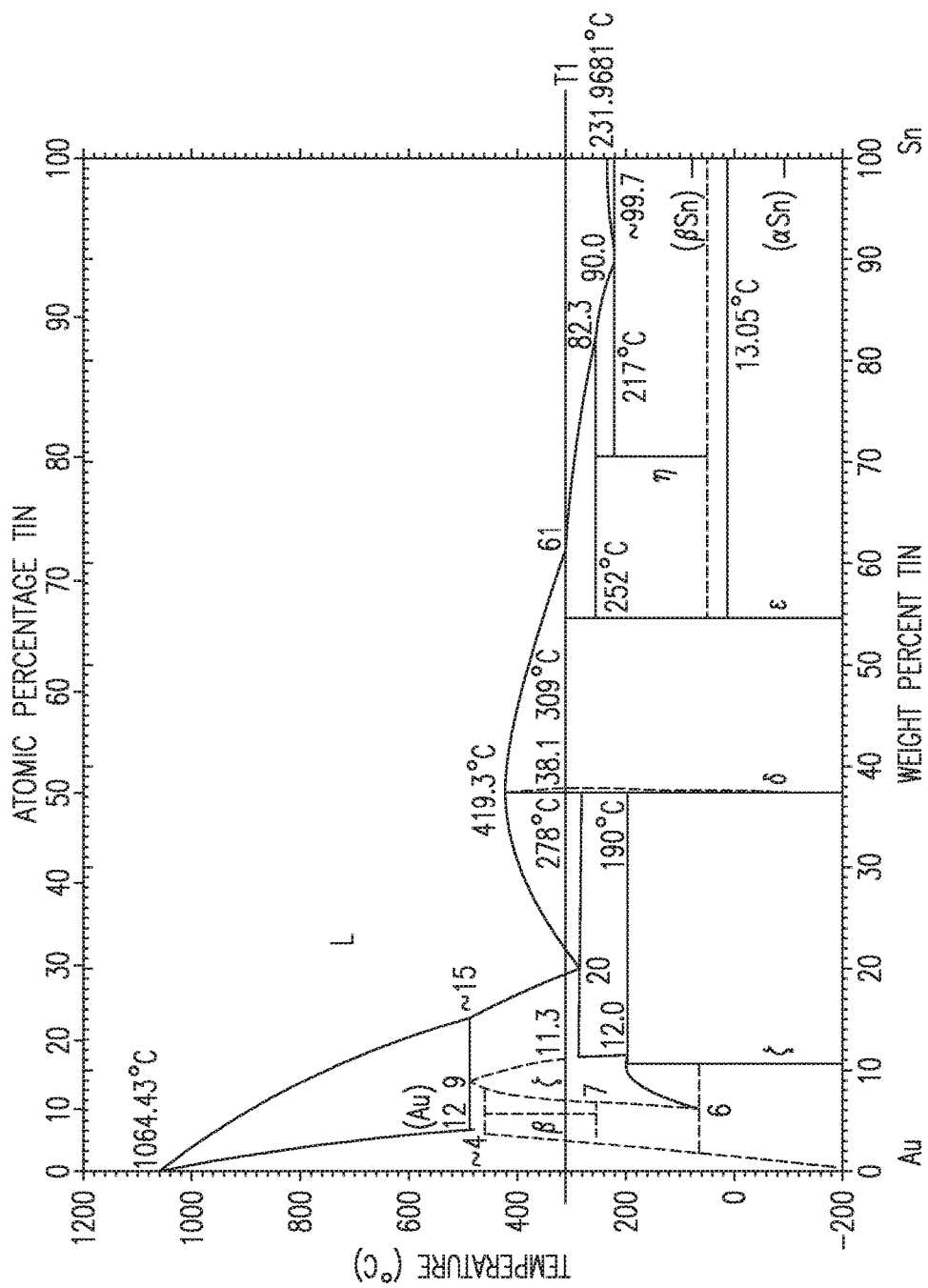
FIGS. 5A and 5B are phase diagrams of gold and tin (Au—Sn) and copper and tin (Cu—Sn), respectively.
Figure 5B:
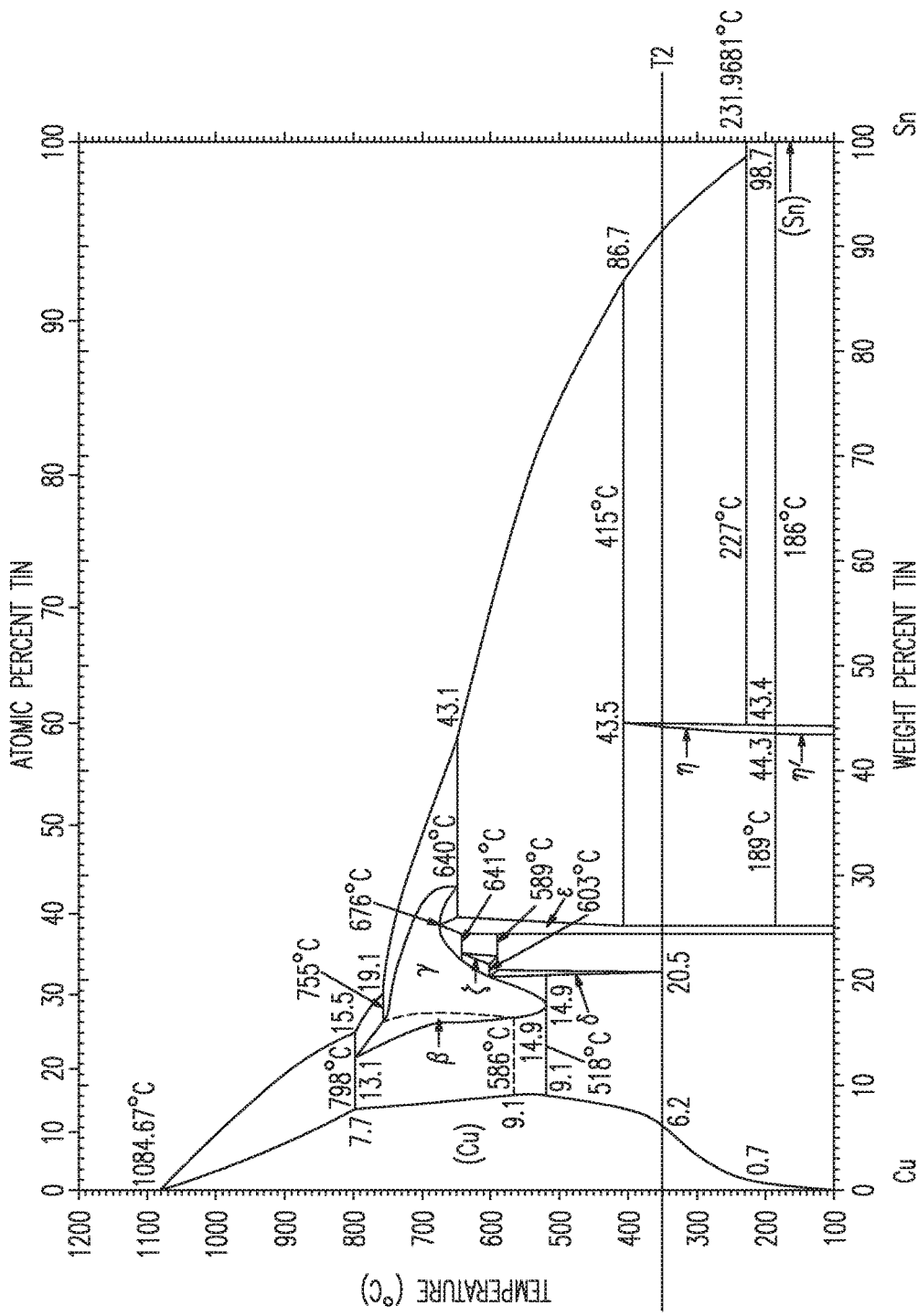

FIGS. 5A and 5B are phase diagrams of gold and tin (Au—Sn) and copper and tin (Cu—Sn), respectively. As can be seen from the phase diagrams, gold as the first metal, copper as the second metal, and tin as the third metal have different melting points and the melting point of tin as the third metal is the lowest of the three metals. Therefore, when the surrounding temperature increases due to the heating, the tin as the third metal starts melting, forms a first alloy of gold-tin with the gold as the first metal, and then forms a second alloy of copper-tin with the copper as the second metal.

The temperature T1 shown in FIG. 5A and the temperature T2 shown in FIG. 5B indicate upper limits of temperatures expected during the heating. In the regions extending up to the temperatures T1 and T2 as upper limits, a melting point of the alloy having certain components is uniquely determined and accordingly the alloy formation can be easily controlled. Furthermore, as can be seen in FIGS. 5A and 5B, the alloy formation starting temperatures or the alloy formation temperatures are different between the first alloy of gold-tin (Au—Sn) and the second alloy of copper-tin (Cu—Sn). Therefore, the melting states of the substantially binary systems may be overlapped rather than the melting states of a ternary system such that the alloy formation can be easily controlled.

As shown in FIG. 4C, the side wall 30 formed by TLP bonding includes the first alloy layer 31 and the second alloy layer 32 and accordingly the third metal layer 38 made of tin as third metal has been consumed and incorporated into the first alloy layer 31 and the second alloy layer 32. The side wall 30 that does not include tin as third metal having a lower melting point now has a remelting temperature that may exceed 300° C. Therefore, the electronic device 100 including the side wall 30 may satisfy a heat-resistant standard required when subject to reflow and implementation.

As shown in FIG. 3, 4A, or 4B, the height of the second side wall 34 is configured to be greater than that of the first side wall 33. Thus, the total of a second thickness of the second metal layer 37 and a third thickness of the third metal layer 38 included in the second side wall 34 is configured to be greater than a first thickness of the first metal layer 36 included in the first side wall 33. Furthermore, regarding the temperatures when the alloy formation starts, tin as the third metal has a lower melting point than copper or gold, and copper as the second metal of the second metal layer 37 forming the second side wall 34 has a higher melting point than gold as first metal of the first metal layer 36 forming the first side wall 33. Therefore, tin as the third metal of the third metal layer 38 having a lower melting point can, before reaching the melting point, start the alloy formation with copper as the second metal of the second metal layer 37 having a greater thickness and forming the second side wall 34. In addition, configuring the third metal layer 38 to have less thickness allows an amount of tin as the third metal of the third metal layer 38 melting and laterally flowing during the bonding to be controlled according to a suitable temperature profile of tin as the third metal reaching the melting point.

Figure 6A:
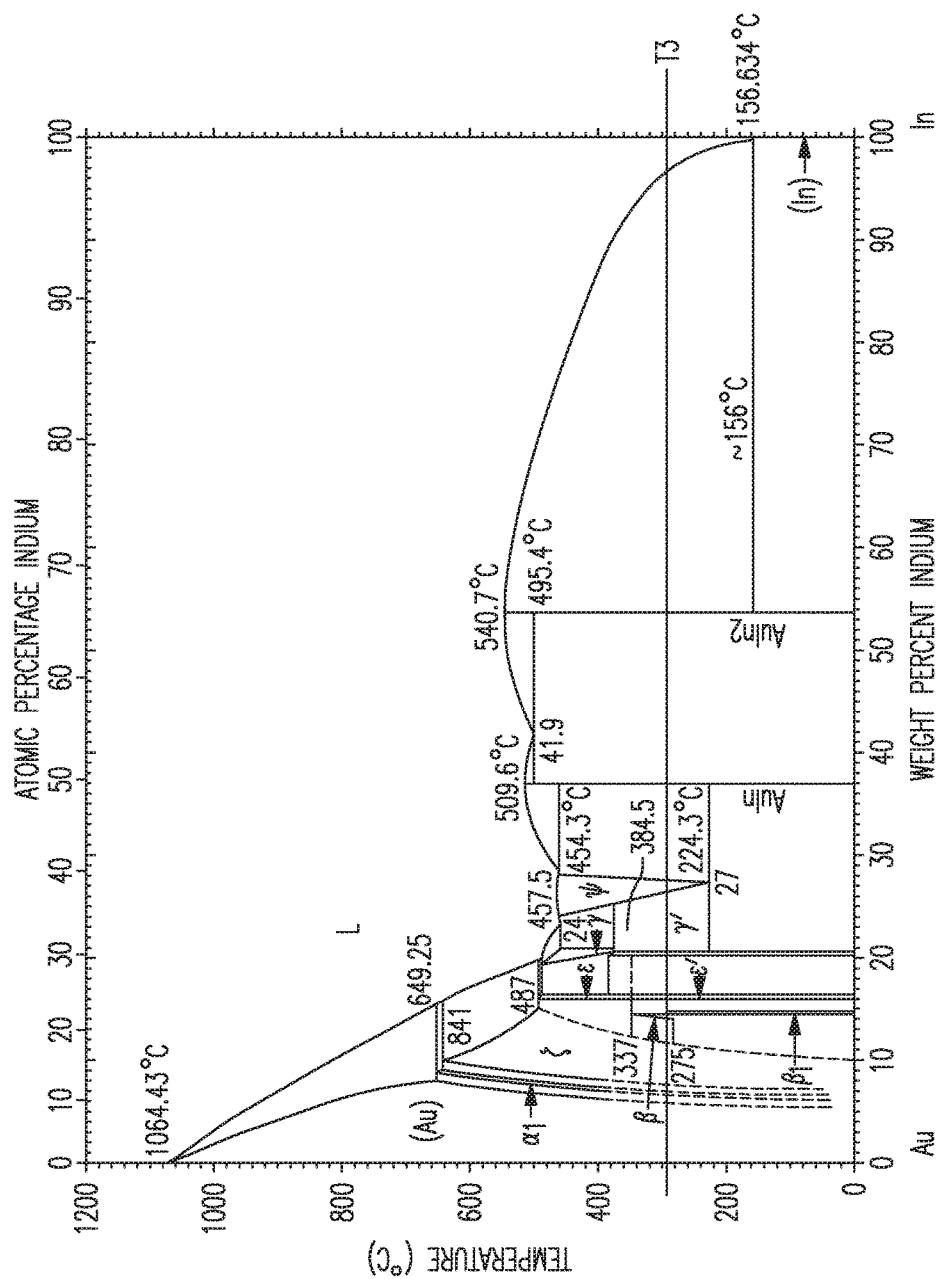
FIGS. 6A and 6B are phase diagrams of gold and indium (Au—In) and copper and indium (Cu—In), respectively.
Figure 6B:
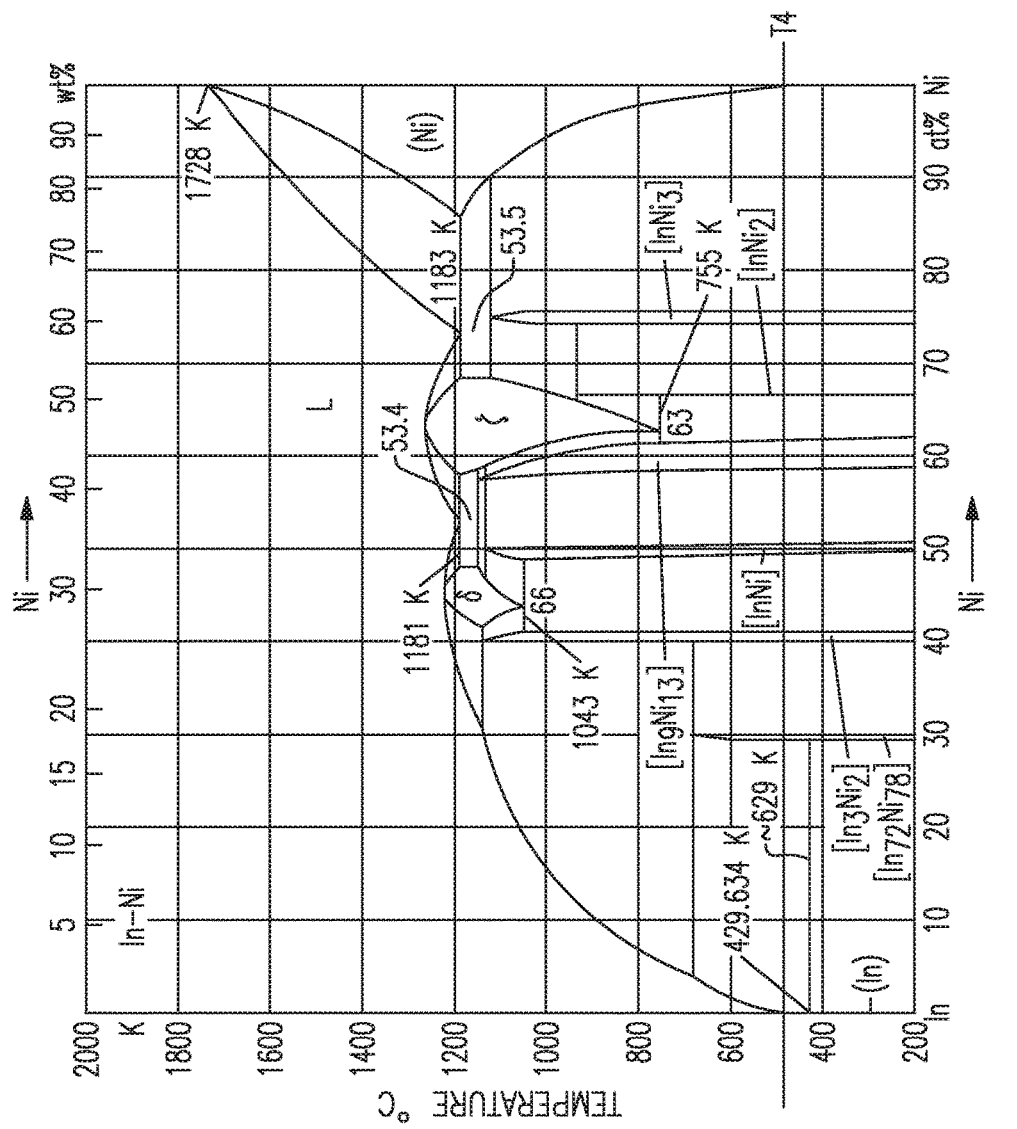

FIGS. 6A and 6B are phase diagrams of gold and indium (Au—In) and copper and indium (Cu—In) respectively. Although tin is illustrated as the third metal of the third metal layer forming the second side wall 34 in the embodiments shown in FIGS. 1 to 5, indium (In) can alternatively be used as the third metal. As can be seen from the phase diagrams of FIGS. 6A and 6B, in the case where indium is used as the third metal, gold as the first metal, copper as the second metal, and indium as the third metal have different melting points, and the melting point of indium as the third metal is the lowest. Therefore, when the surrounding temperature increases due to the heating, the indium as the third metal melts, forms a first alloy of gold-indium with the gold as the first metal, and then forms a second alloy of copper-indium with the copper as the second metal.

In the case where indium is used as the third metal, the heating process is performed while the first substrate 10 and the second substrate 20 are maintained in a low pressure atmosphere at temperatures ranging from 170° C. to 200° C. over five to 10 minutes. The temperature T3 shown in FIG. 6A and the temperature T4 shown in FIG. 6B indicate upper limits of temperatures expected during the heating. The case where indium is used as the third metal of the third metal layer 38 is similar to embodiments where tin is used as third metal of the third metal layer 38, except for the heated surrounding temperatures and the like.

According to an aspect of the present disclosure, the thickness of the first substrate 10 is different from that of the second substrate 20. For example, the thickness of the first substrate 10 may be greater than that of the second substrate 20 and also the thickness of the first substrate 10 may be less than that of the second substrate 20. The thickness of the first substrate 10 is different from that of the second substrate 20 and, when the first side wall 33 and the second side wall 34 are aligned and in contact with each other as shown in FIG. 3, the temperature of the first metal layer 36 contacting the third metal layer 38 is different from that of the second metal layer 37, on which the third metal layer 38 is stacked, due to the difference in heat conduction. According to an aspect of the present disclosure, tin as the third metal of the third metal layer 38 has distinct starting temperatures of alloy forming respectively with gold as the first metal of the first metal layer 36 and copper as the second metal of the second metal layer 37, such that the difference between the starting temperatures is greater than the temperature difference originating from the thickness difference between the first substrate 10 and the second substrate 20. Therefore, the bonding can be made under no influence of the difference in thickness between the first substrate 10 and the second substrate 20.

In the structure 150 in which the electronic device 100 is implemented on the printed circuit board 110 as shown in FIG. 2, the resin layer 120 includes fillers 121 each having a certain diameter. Here, for example, the resin layer 120 may be made of epoxy resin and the filler 121 may be made of silica. According to an aspect of the present disclosure, there is a relationship between a distance t defined by the side wall 30 internally withdrawn from the periphery 10$d$ of the first substrate 10 and the periphery 20$d$ of the second substrate 20 and a particle diameter d of the filler 121 as follows:

$$t \leq (\text{averaged } d)/2.$$

Thus, the distance t defined by the side wall 30 internally withdrawn from the periphery 10d of the first substrate 10 and the periphery 20d of the second substrate 20 is no more than half of the average of the particle diameters of the fillers 121 included in the resin layer 120.

According to an aspect of the present disclosure, if the distance t defined by the side wall 30 internally withdrawn from the periphery 10d of the first substrate 10 and the periphery 20d of the second substrate 20 satisfies the aforementioned relationship with the particle diameter d of the filler 121, then the filler 121 is prevented from penetrating into the gap defined between the bottom surface 10a of the first substrate 10 and the top surface 20a of the second substrate 20. Therefore, the gap is filled with the resin layer 120 of lower elastic modulus rather than the filler 121 of higher elastic modulus, such that heat cycle tolerance of the structure 150 in which the electronic device 100 is implemented on the printed circuit board 110 can be improved. Furthermore, according to the present disclosure, the side wall 30 is internally withdrawn from the periphery 10d of the first substrate 10 and the periphery 20d of the second substrate 20 by a certain distance t, and thus the side wall 30 made of metal does not need to be cut in a process for dicing the first substrate 10 and the second substrate 20 into pieces from the wafer, such that the dicing process can be easily performed. For example, the thickness of the dicing blade for cutting the wafer does not have to be configured to be greater, as it need not cut through the metal side wall 30.

As shown in FIG. 1, according to the present disclosure, the external electrode 40 is disposed on the top surface 10b of the first substrate 10 configured as a device substrate in the electronic device 100. The external electrode 40 is connected to a wiring pad 12 of the electronic circuit 18 disposed on the bottom surface 10a of the first substrate 10 by a via 42, which is formed in a through-hole 10c (see FIG. 7) passing through the first substrate 10 between the top surface 10b and the bottom surface 10a. The external electrode 40 includes a via 42 and an external electrode layer 43 disposed on a top surface of the via 42. According to an aspect of the present disclosure, the via 42 is formed not only by the metal filled into the through-hole 10c but also integrally with a metal layer formed to have a certain thickness in a certain region around the through-hole 10c on the top surface 10b. Here, the via 42 is formed by copper plating and the external electrode layer 43 is formed by solder plating. The via 42 has a portion formed on a sputtered film 41 deposited for surface treatment.

According to an embodiment, the external electrode 40 is disposed on the first substrate 10 configured as a device substrate on which the electronic circuit 18 is disposed. Furthermore, the external electrode 40 is disposed directly above the through-hole 10c (see FIG. 7) at the level of the top surface 10b. Therefore, a wiring distance extending from the electronic circuit 18 to the external electrode 40 can be configured to be short so that the number of connection points can be reduced. Accordingly, the characteristics of the electronic device such as an insertion loss of the filtering can be improved.

Furthermore, in the structure 150 in which the electronic device 100 is implemented on the printed circuit board 110 as shown in FIG. 2, the electronic device 100 is connected to an electrode 111 by the external electrode 40 disposed on the top surface 10b of the first substrate 10 configured as device substrate. The electrode 111 is disposed on a top surface 110a of the printed circuit board 110. Therefore, the distance between the printed circuit board 110 and the first substrate 10, i.e., the distance between the top surface 110a of the printed circuit board 110 and the top surface 10b of the first substrate 10, can be minimized such that the stress acting due to a difference in linear expansion coefficient between the printed circuit board 110 and the first substrate 10 or the second substrate 20 configured as cap substrate can be reduced. Accordingly, it is possible to reduce a frequency variation during a reliability test.

Furthermore, the electronic device according to the present disclosure may be configured to have the first substrate 10 thinner than the second substrate 20. According to an embodiment, the electronic circuit 18 is disposed on the bottom surface 10a of the first substrate configured as device substrate including the through-hole 10c and the external electrode 40 such that the stress acting on the first substrate 10 after implementation as shown in FIG. 2 can be reduced. As a result, the first substrate 10 can be configured to have a reduced thickness. The less the thickness of the first substrate 10 becomes, the less the aspect ratio of the through-hole 10c becomes. Therefore, it is possible to reduce the stress originating from the difference in linear expansion coefficient between the metal of the via 42 filled in the through-hole 10c and the first substrate 10 and thus, to improve heat cycle tolerance.

In the electronic device 100 of the embodiment shown in FIG. 1, the top surface 10b of the first substrate 10 on which the external electrode 40 is disposed is configured to be more roughened than the bottom surface 10a on which the electronic circuit 18 is disposed. Furthermore, a sputtered film 41 is deposited to ensure the adhesiveness between the external electrode 40 and the top surface 10b of the first substrate 10. Accordingly, because the top surface 10b of the first substrate 10 is configured as more roughened, the contact area with the sputtered film 41 can increase to improve the adhesive strength.

Furthermore, in the electronic device 100 of the present disclosure, the side surface of the through-hole 10c formed in the first substrate 10 is more roughened than the bottom surface 10a of the first substrate upon which the electronic circuit 18 is disposed. The through-hole 10c is filled with metal forming the via 42 and, because the side surface of the through-hole 10c is configured as oblique, the film formation energy is so dispersed that the adhesive strength may be lowered. According to the present disclosure, the sputtered film 41 is deposited on the roughened side surface of the through-hole 10c to ensure the adhesive strength between the sputtered film 41 and the side surface of the through-hole 10c similar to that between the sputtered film 41 and the top surface 10b.

In the electronic device 100 of the embodiment shown in FIG. 1, the first substrate 10 may have graded thickness such that a portion including the electronic circuit 18 and defining a cavity 19 is thicker than a portion where the bottom surface 10a of the first substrate 10 is connected to the top surface 20a of the second substrate 20 by the side wall 30. The graded thickness may allow the portion including the electronic circuit 18 and defining the cavity 19 of the first substrate 10 to tolerate the tensile stress generated during a substrate bending test and the like in the structure 150 in which the printed circuit board 110 is implemented.

Figure 7:
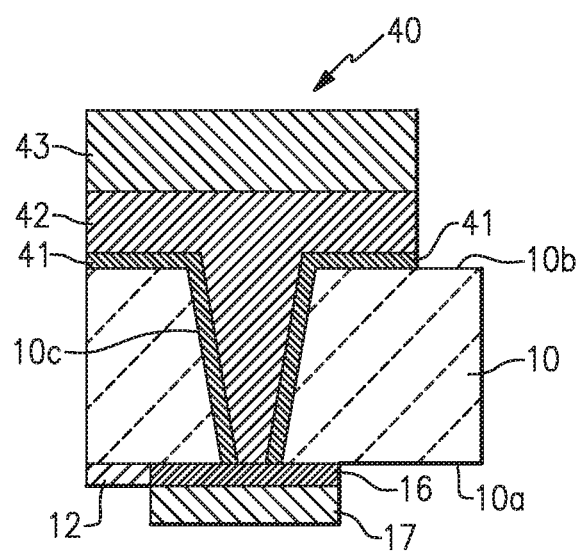
FIG. 7 is a partially enlarged cross-sectional view illustrating a stop layer of a via in accordance with an embodiment.

FIG. 7 is a partially enlarged cross-sectional view illustrating a stop layer of a via. As shown in FIG. 1, in the electronic device 100, a first stop layer 16 and a second stop layer 17 are sequentially stacked on the bottom surface 10a of the first substrate 10 directly under the via 42. Etching rates are different between the first substrate 10, the first stop layer 16 and the second stop layer. Specifically, the etching rate of the first substrate 10 is greater than that of the first stop layer 16 whereas that of the first stop layer 16 is greater than that of the second stop layer 17.

The electronic device 100 of the present disclosure is configured to have the first stop layer 16 and the second stop layer 17 sequentially stacked on the first substrate 10 directly under the via 42 and also have the etching rate of the first substrate 10 greater than that of the first stop layer 16 and that of the first stop layer 16 greater than that of the second stop layer 17 such that a notch generation due to overetching during the formation of the through-hole 10c at the bottom portion of the via 42, i.e., a portion where the side surface of the through-hole 10c intersects with the bottom surface 10a of the first substrate 10, can be suppressed. This may allow the metal to be filled in the through-hole 10c without any defects when the via 42 is formed and thus the yield and the reliability of the product to be improved.

According to embodiments disclosed herein, the through-hole 10c of the first substrate 10 may be formed by dry etching process. Upon configuring the etching rate of the first substrate 10 to be greater than that of the first stop layer 16 and the first stop layer 16 to be greater than the second stop layer 17, the dry etching may allow for a wide variety of choices of the materials. In contrast, when the through-hole 10c is formed by wet etching process, it would be difficult to choose the materials for the etching rate of the first substrate 10 being greater than that of the first stop layer 16 and that of the first stop layer 16 being greater than that of the second stop layer 17.

According to the present disclosure, titanium (Ti), chromium (Cr) and the like are used for the first stop layer 16 and gold (Au) and the like are used for the second stop layer 17. Using these kinds of metals, it is possible to achieve a relationship in which the etching rate of the first substrate 10 is greater than that of the first stop layer 16 and that of the first stop layer 16 is greater than that of the second stop layer 17 and therefore the notch generation can be suppressed at the bottom portion of the via 42.

According to an aspect of the present disclosure, the first stop layer 16 made of titanium or chromium is provided to eliminate an adhesive layer for adhering the second stop layer 17. Although such an adhesive layer has been commonly used for adhering the surface with a film formed by vapor deposition or sputtering, the first stop layer 16 made of titanium or chromium may function as the adhesive layer.

According to an aspect of the present disclosure, the first stop layer 16 is thinner than the second stop layer 17. The reduced thickness of the first stop layer 16 may prevent in-plane etching conditions from varying due to the decrease of the etching rate when the first stop layer 16 is etched. Thus, it is possible to ensure that the first stop layer 16 can be totally removed from the bottom surface of the through-hole 10c by the etching and there would be no first stop layer 16 partially remaining. Furthermore, the increased thickness of the second stop layer 17 may ensure the strength of the second stop layer 17 after the etching. When the etching is finished, there is only a thinned second stop layer 17 remaining on the bottom surface of the through-hole 10c.

Although the first stop layer 16 and the second stop layer 17 are disposed on the bottom surface 10a of the first substrate 10 directly under the via 42 as shown in FIGS. 1 and 7, the first stop layer 16 and the second stop layer 17 may be extended to cover the wiring pad 12 of the electronic circuit 18 disposed on the bottom surface 10a of the first substrate 10. Furthermore, the first stop layer 16 and the second stop layer 17 may be used as a substitution of the wiring pad 12 of the electronic circuit 18. The first stop layer 16 and the second stop layer 17 have a thickness greater than the wiring pad 12 and may lower the wiring resistance. Therefore, the first stop layer 16 and the second stop layer 17 can be extended over the wiring pad 12 and used for the wiring pad 12 such that the insertion loss of the electronic device 100 can be lowered.

Figure 8A:
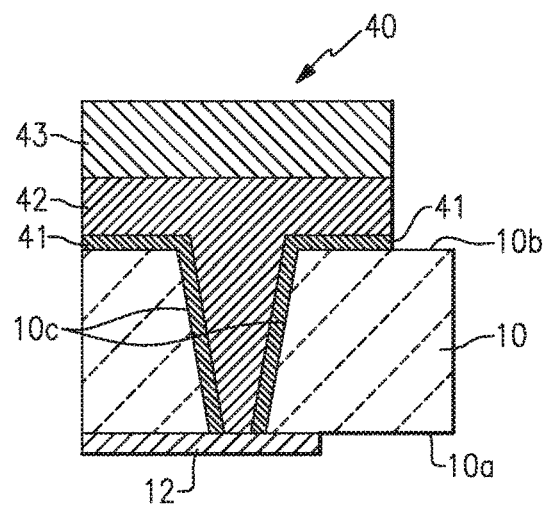
FIGS. 8A-8C are partially enlarged cross-sectional views illustrating a conventional via.
Figure 8B:
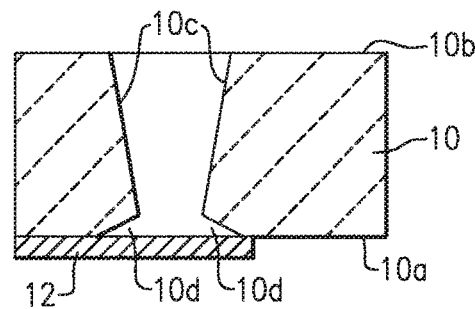
Figure 8C:
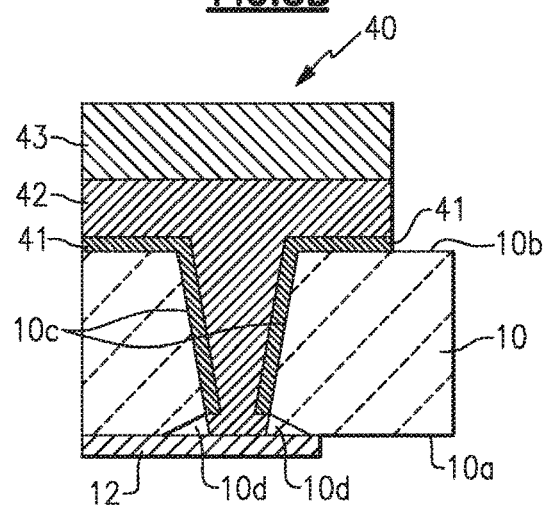

FIGS. 8A-8C are partially enlarged cross-sectional views illustrating a conventional via at the bottom of which no stop layer exists as a comparative example. As shown in FIG. 8A, the wiring pad 12 of the electronic circuit 18 is extended to a location directly under the via 42 and connected to the via 42 with no stop layer interposed. According to such a conventional configuration as shown in FIG. 8B, when a through-hole 10c is formed in the first substrate 10 by etching, a notch 10d may be generated due to overetching at a portion where the side surface of the through-hole 10c intersects with the bottom surface 10a. As shown in FIG. 8C, when metal is to be filled into a through-hole 10c, which includes a notch 10d created at the bottom, to form the via 42, the metal sometimes fails to enter a portion of the notch 10d and causes a defect of insufficient metal, which thus may reduce the yield of electronic devices 100.

The electronic device 100 of the embodiment shown in FIG. 1 includes a column 50 formed between the bottom surface 10a of the first substrate 10 and the top surface 20a of the second substrate 20 directly under the via 42. The column 50 is configured to have a diameter greater than that of the via 42. The first stop layer 16 and the second stop layer 17 are interposed between the bottom surface 10a of the first substrate 10 and the column 50. Similar to the side wall 30, the column 50 is formed by a first alloy layer 51 made of gold-tin alloy and a second alloy layer 52 made of tin-copper alloy sequentially stacked.

When the first substrate 10 and the second substrate 20 are aligned as shown in FIG. 3, a first column 53 is disposed on the bottom surface 10a of the first substrate 10 directly under the via 42 and a second column 54 is disposed on the top surface 20a of the first substrate 10 at a location corresponding to the first column 53. The first column 53 is formed by a first metal layer 56 made of gold as the first metal and having a first thickness. The second column 54 is formed by a second metal layer 57 and a third metal layer 58 sequentially stacked. The second metal layer 57 is made of copper as the second metal and has a second thickness. The third metal layer 58 is made of tin as the third metal and has a third thickness. Here, the first column 53 has a diameter greater than that of the second column 54.

As shown in FIG. 3, the first substrate 10 and the second substrate 20 are aligned with each other such that the bottom surface 10a of the first substrate 10, the top surface 20a of the second substrate 20, the second side wall 34 and the first side wall 33 can internally define a cavity 19. The first side wall 33 and the second side wall 34 oppose and contact each other, while the first column 53 and the second column 54 oppose and contact each other. Thus, the bottom surface of the first column 53 abuts onto the top surface of the second column 54. According to an aspect of the present disclosure, the first substrate 10 and the second substrate 20 are maintained in the aligned state and heated such that the first side wall 33 and the second side wall 34 are bonded with each other by transient liquid phase (TLP) bonding into a single side wall 30 while the first column 53 and the second column 54 are also bonded with each other by TLP bonding into a single column 50. The TLP bonding process applied to the first column 53 and the second column 54 may be similar to that of the first side wall 33 and the second side wall 34 shown in FIG. 4.

According to the structure 150 in which the electronic device 100 is implemented on the printed circuit board 110 as shown in FIG. 2, a resin layer 120 is interposed between the top surface 110a of the printed circuit board 110 and the electronic device 100. When a heat cycle test is performed to the structure 150, the resin layer 120 interposed between the printed circuit board 110 and the electronic device 100 may expand and contract to generate tensile stress against the via 42. According to the present disclosure, the column 50 having a diameter greater than that of the via 42 is disposed directly under the via 42. Therefore, a strength tolerant to the effect on the via 42 caused by such tensile stress and heat cycle can be ensured and the reliability can be improved. For example, it is possible to prevent a disconnection due to metal fatigue between the via 42 and the first stop layer 16, the second stop layer 17, or the wiring pad 12.

Furthermore, according to the present disclosure, the first column 53 formed by the first metal layer 56 made of gold as the first metal has a diameter greater than that of the second column 54 formed by the second metal layer 57 made of copper as the second metal and the third metal layer 58 made of tin as the third metal. The TLP bonding allows the tin as the third metal of the third metal layer 58 having a lower melting point to wet and spread over the gold as the first metal of the first metal layer 56, such that the cross-section of the first alloy layer 51 made of gold-tin alloy can be gently tapered. Therefore, it is possible to prevent stress concentration onto a portion where the bottom surface 10a of the first substrate 10 intersects with the column 50 and thus the reliability can be further improved.

Furthermore, according to aspects of the present disclosure, the through-hole 10c can be formed in the first substrate 10 by laser. As shown in FIG. 1, according to an embodiment, the column 50 is disposed on the bottom of the through-hole 10c with the first stop layer 16 and the second stop layer 17 interposed. Therefore, even if the first stop layer 16 and the second stop layer 17 are heated from the bottom of the through-hole 10c when the through-hole 10c is formed by laser, the heat is rapidly dissipated through the column 50 connected directly under the first stop layer 16 and the second stop layer 17 and thus the first stop layer 16 and the second stop layer 17 are protected from the heat. Therefore, lithium tantalate, lithium niobate, sapphire, glass and the like, which are difficult to be processed by wet etching or dry etching when the through-hole 10c is formed, can be used as material for the first substrate 10 to be processed by laser.

As shown in FIG. 1, the electronic device 100 has a cavity 19 internally defined by the bottom surface 10a of the first substrate 10, the top surface 20a of the second substrate 20, and the side wall 30. According to an aspect of the present disclosure, the cavity 19 is filled with nitrogen or air and maintained at a pressure lower than one atmosphere in pressure. Maintaining the cavity 19 below one atmosphere in pressure may reduce the air resistance acting when the film bulk acoustic resonator 11 of the electronic circuit 18 oscillates within the cavity 19 such that the Q factor can be ensured and better characteristics can be achieved.

According to an aspect of the present disclosure, the first side wall 33 and the second side wall 34 are bonded by TLP bonding under vacuum while the first substrate 10 and the second substrate 20 are in the aligned state as shown in FIG. 3. Therefore, even if the first side wall 33 and the second side wall 34 are heated during the TLP bonding process, the gold as the first metal of the first metal layer 36 forming the first side wall 33 as well as the copper as the second metal of the second metal layer 37 and the indium as the third metal of the third metal layer 38 forming the second side wall 34 can be prevented from oxidizing and nitriding. The prevention of oxidation may be advantageous to the TLP bonding of the present disclosure because, if the copper as the second metal of the second metal layer 37 is oxidized, the second alloy made of copper and tin may not be formed in the second alloy layer 32 of the side wall 30 as shown in FIG. 1.

Still further, according to aspects of the present disclosure, the first substrate 10 and the second substrate 20 aligned as shown in FIG. 3 may be stored in a suitable chamber, which can be maintained at a suitable degree of vacuum by a low-pressure control valve. Accordingly, the inside of the cavity 19 in the electronic device 100 can be set to a suitable degree of vacuum and thus the TLP bonding between the first substrate 10 and the second substrate 20 can be reliably achieved. Yet still further, a preheating process is performed at a temperature of 100° C. or less prior to the TLP bonding between the first substrate 10 and the second substrate 20 in the aligned state shown in FIG. 3A. The preheating process would not melt even the indium of a lower melting point as the third metal of the third metal layer 38 forming the second side wall 34 because the preheating temperature is set as 100° C. or less. In addition, the copper as the second metal of the second metal layer 37 in the second side wall 34 can also be prevented from oxidation. Therefore, the formation of the second alloy made of copper-tin of the second alloy layer 32 of the side wall 30 as shown in FIG. 1 would not be inhibited.

As shown in FIG. 1, the electronic device 100 has the external electrode 40 and the via 42 integrally formed with each other. The via 42 is integrally formed not only by the metal filled into the through-hole 10c passing through the first substrate 10 between the top surface 10b and the bottom surface 10a, but also by a metal layer formed to have a certain thickness on the top surface 10b in a certain region around the through-hole 10c. An external electrode layer 43 is disposed on the via 42.

Figure 9:
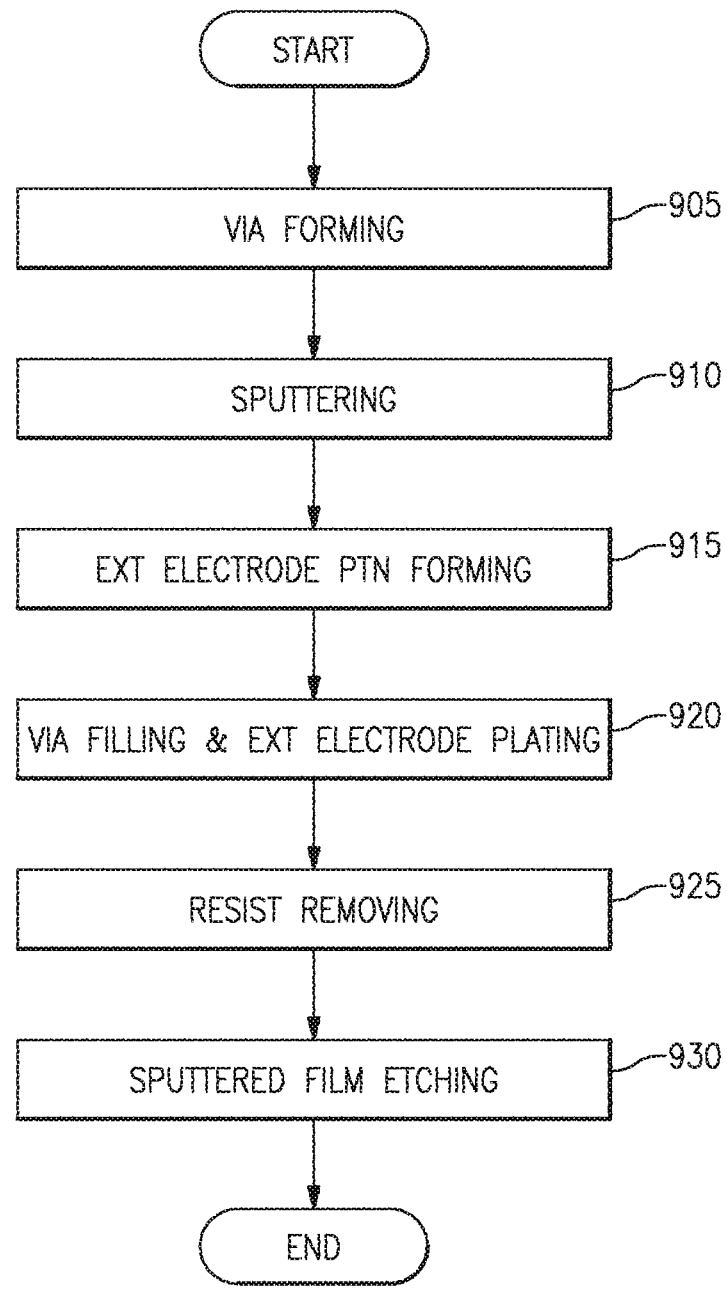
FIG. 9 is a flow chart of a process to form a via and an external electrode in accordance with an embodiment.

FIG. 9 is a flow chart showing a series of steps to form the via and the external electrode according to the present disclosure. At step 905, a through-hole 10c is formed to pass through the first substrate 10 between the bottom surface 10a and the top surface 10b. The through-hole 10c may be formed for example by laser, dry etching, or wet etching. At step 910, a sputtered film 41 is formed on the top surface 10b of the first substrate 10 and the side surface of the through-hole 10c. Here, the sputtered film 41 allows for an adhesion of plated metal. At step 915, a negative-type liquid resist is used to form a resist pattern of the external electrode 40.

At step 920, copper is plated on the sputtered film 41. This allows copper to be filled into the through-hole 10c and also to be plated as metal layer in a certain region around the through-hole 10c on the top surface 10b of the first substrate 10 and a via 42 is formed. Furthermore, an external electrode layer 43 is formed by solder plating on the top surface of the via 42 to have a certain thickness. The via 42 and the external electrode layer 43 constitutes the external electrode 40. At step 925, the resist formed at step 915 is removed. At step 930, the sputtered film 41 is removed from the top surface 10b of the first substrate 10 except for the region where the external electrode 40 is formed.

According to an embodiment, the metal filled into the through-hole 10c of the first substrate 10 and the metal layer formed in a certain region around the through-hole 10c on the top surface 10b of the first substrate 10 to support the external electrode layer 43 are integrally formed into the via 42. Therefore, the via 42 directly connects the external electrode layer 43 of the external electrode 40 disposed on the top surface 10b of the first substrate 10 with the first stop layer 16, the second stop layer 17, or the wiring pad 12 disposed on the bottom surface 10a of the first substrate 10 such that the connection resistance and thus the insertion loss of the electronic device can be lowered.

Furthermore, according to an aspect of the present disclosure, negative-type liquid resist is used for forming a pattern of the external electrode 40. Therefore, the external electrode 40 can be patterned by preventing the resist from flowing into the through-hole 10c. The prevention can be achieved by controlling diameter and depth of the through-hole 10, volume of the via 42, viscosity of the resist, and/or pre-baking period of time for the resist.

Figure 10:
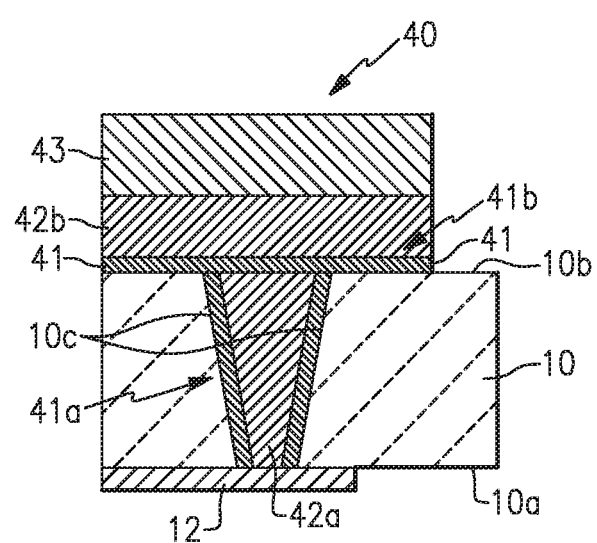
FIG. 10 is a partially enlarged cross-sectional view illustrating a structure of conventional via and external electrode.

FIG. 10 is a partially enlarged cross-sectional view illustrating a structure of a conventional via and external electrode as a comparative example. The conventional via includes a metal-filled portion 42a formed in a through-hole 10c of the first substrate 10 with a first sputtered film 41a interposed. The conventional external electrode 40 includes an external electrode support layer 42b and an external electrode layer 43. The external electrode support layer 42b is formed on the top surface 10b of the first substrate 10 with a second sputtered film 41b interposed. The external electrode layer 43 is formed on the external electrode support layer 42b. Although the metal-filled portion 42b of the conventional via and the external electrode support layer 42b of the external electrode 40 are formed by copper plating similar to the via 42 of the external electrode 40 according to the previously described embodiments, what is different is that the second sputtered film 41b is interposed between the metal-filled portion 42a and the external electrode support layer 42b.

Figure 11:
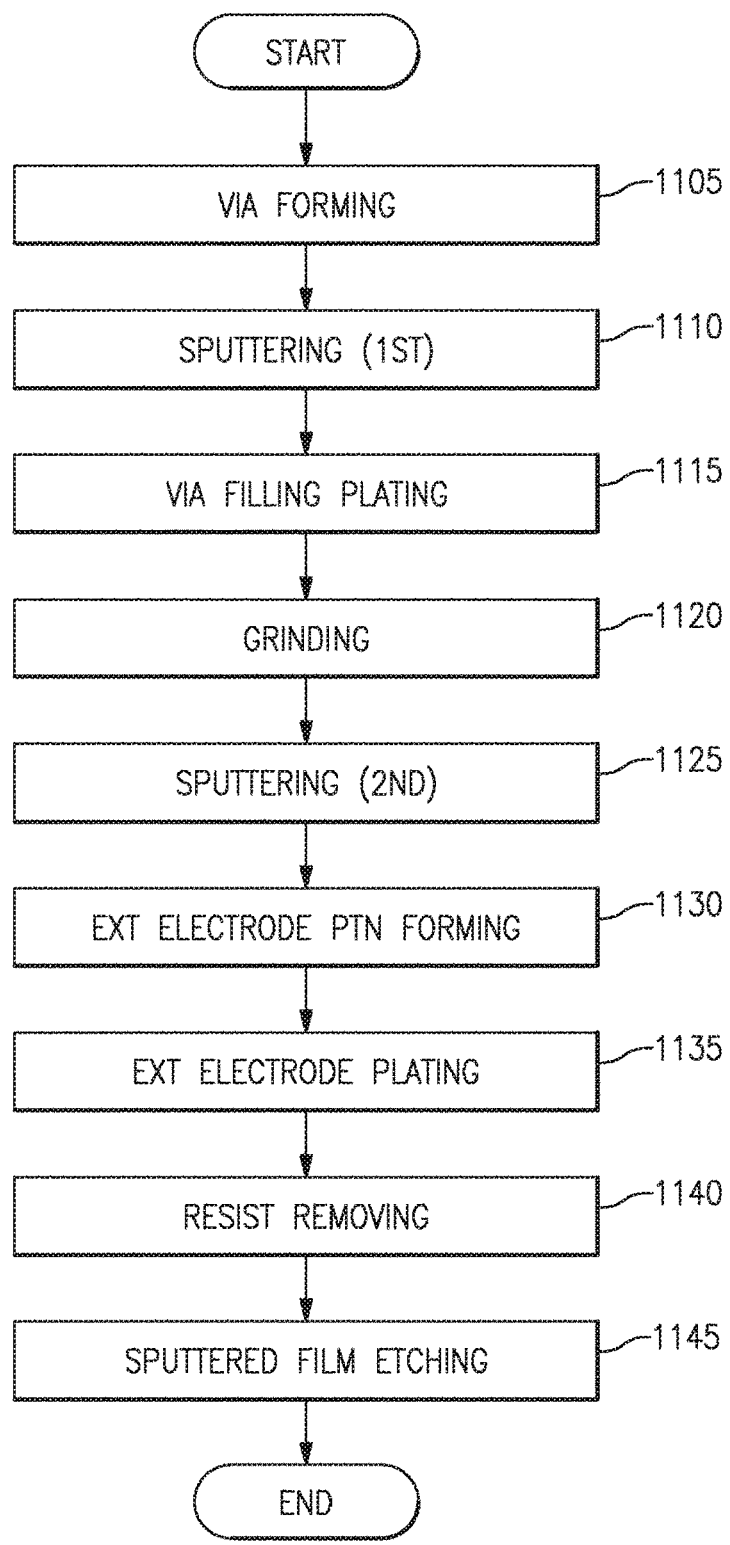
FIG. 11 is a flow chart of a process to form conventional via and external electrode.

FIG. 11 is a flow chart showing a series of steps to form the conventional via and external electrode. At step 1105, a through-hole 10c is formed in the first substrate 10. At step 1110, a first sputtered film 41a is formed by a first sputtering to cover a region including the side surface of the through-hole 10c. At step 1115, a metal-filled portion 42a is formed by copper plating on the first sputtered film 41a of the through-hole 10c. At step 1120, the top surface 10b of the first substrate 10 is polished to remove a copper plated portion and the first sputtered film 41a formed on the top surface 10b.

At step 1125, a second sputtered film 41b is formed by a second sputtering on the top surface 10b of the first substrate 10 including the metal-filled portion 42a. At step 1130, a resist pattern of the external electrode 40 is formed by photolithography. At step 1135, an external electrode support layer 42b is formed by copper plating and an external electrode layer 43 is formed by solder plating. At step 1140, the resist is removed. At step 1145, the second sputtered film 41b is removed from the top surface 10b of the first substrate 10 except for a portion where the external electrode 40 is formed.

According to the conventional via and external electrode 40 shown in FIG. 10 and the method of manufacturing the conventional via and external electrode 40 shown in FIG. 11, the metal-filled portion 42a and the external electrode support layer 42b are formed by separate steps such that the second sputtered film 41b is interposed between the metal-filled portion 42a and the external electrode support layer 42b. Thus, the number of steps increases and the connection resistance between the metal-filled portion 42a and the external electrode layer 43 increases due to the interposed second sputtered film 41b.

Figure 12A:
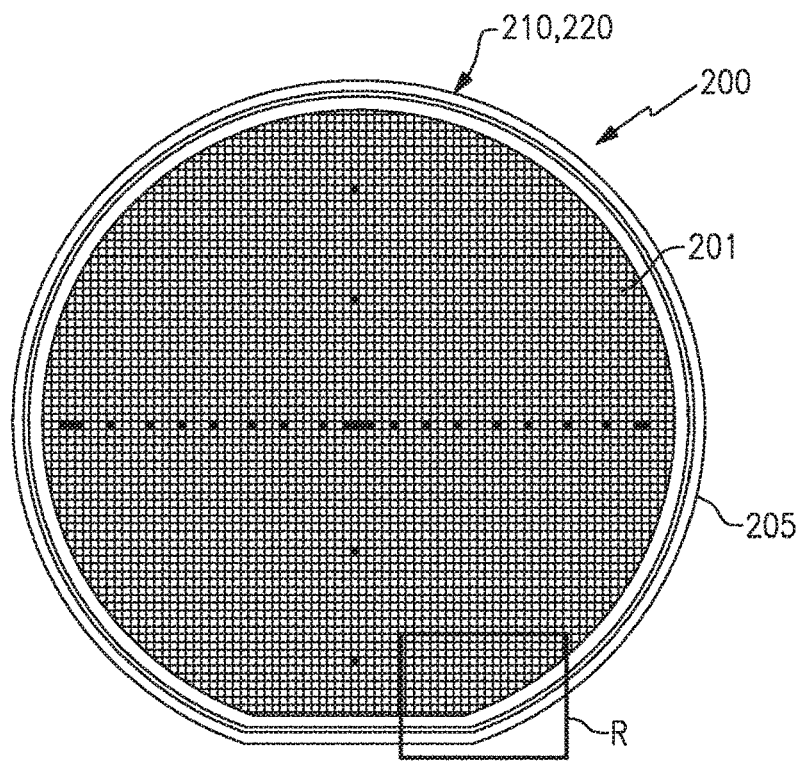
FIGS. 12A and 12B illustrate a method of manufacturing an electronic device according to embodiments described herein.

With continuing reference to FIGS. 1 and 2, and with reference to FIGS. 13A and 13B, FIGS. 12A and 12B illustrate a method of manufacturing an electronic device according to the present disclosure. FIG. 12A shows a structure 200 including a first wafer 210 having a plurality of first substrates 10 arranged to form the electronic device 100 and a second wafer 220 having a plurality of second substrates 20 arranged to form the same electronic device 100 such that the first wafer 210 and the second wafer 220 are aligned and bonded by TLP bonding with each other. In other words, FIG. 12A shows a state where the electronic device 100 shown FIG. 1 has not yet to be diced into a piece from the first wafer 210 and the second wafer 220 and the plurality of the electronic devices 100 are coupled to each other.

Figure 12B:
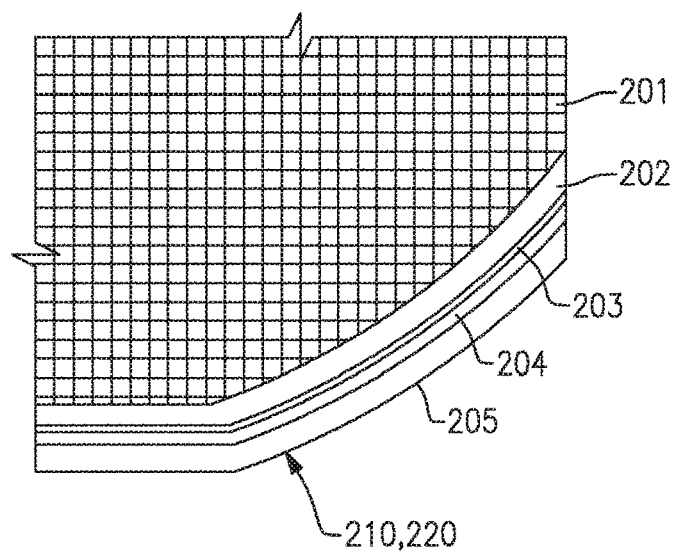

FIG. 12B is a partially enlarged view of a boxed region R shown in FIG. 12A that shows the structure 200 including substantially circular-shaped first and second wafer 210 and 220. As shown in FIGS. 12A and 12B, the portion where the configuration of the electronic device 100 is formed corresponds to an effective area 201. A non-effective area 202, a ring-shaped sealing portion 203, and a plating power supply portion 204 having respective widths are sequentially formed outwardly from the effective area 201 along a periphery 205.

According to the present disclosure, the sealing portion 203 is configured similar to the first side wall 33 disposed on the bottom surface 10a of the first substrate 10 and the second side wall 34 disposed on the top surface 20a of the second substrate 20. Thus, a first sealing portion is formed along the periphery 205 on the bottom surface of the first wafer 210 and a second sealing portion is formed on the top surface of the second wafer 220 at a portion corresponding to the first sealing portion. The first sealing portion includes a first metal layer made of gold as the first metal and having a first thickness. The second sealing portion includes a second metal layer made of copper as the second metal and having a second thickness and a third metal layer made of tin as the third metal and having a third thickness, which are sequentially stacked.

When the first wafer 210 and the second wafer 220 are aligned with each other and bonded by TLP bonding, the first side wall 33 and the second side wall 34 are aligned to oppose and contact each other, while the first sealing portion and the second sealing portion are aligned to oppose and contact each other such that a cavity 19 is internally defined by the first side wall 33 formed on the first wafer 210 and the second side wall 34 formed on the second wafer 220, similar to the case where the first substrate 10 and the second substrate 20 are aligned as shown in FIG. 3. Thus, the bottom surface of the first sealing portion abuts onto the top surface of the second sealing portion. The first wafer 210 and the second wafer 220 are then heated in the aligned state and the first side wall 33 and the second side wall 34 are bonded by TLP bonding to form a single side wall 30 while the first sealing portion and the second sealing portion are bonded by TLP bonding to form a single sealing portion 203. The TLP bonding process of the first sealing portion and the second sealing portion is similar to that of the first side wall 33 and the second side wall 34 as shown in FIGS. 4A-4C.

Figure 13A:
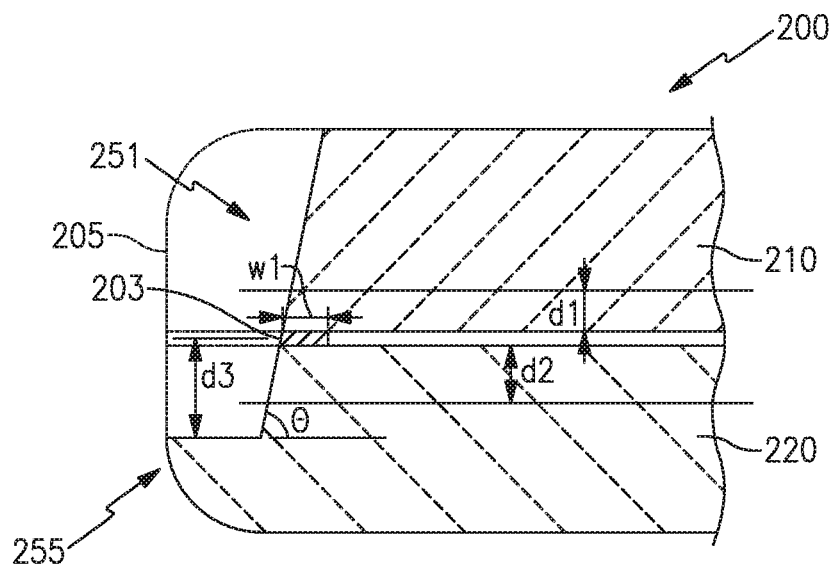
FIGS. 13A and 13B are cross-sectional views showing edge trimmed first and second wafers.

FIG. 13A is a cross-sectional view illustrating a state where the structure 200 of the first wafer 210 and the second wafer 220 bonded with each other is edge trimmed. As shown in FIG. 13A, the structure 200 of the first wafer 210 and the second wafer 220 bonded with each other is ground from the periphery 205 to a position where the ring-shaped sealing portion 203 is formed. Here, the sealing portion 203 is processed to ensure a length w1, for example, of 150 µm along the bottom surface of the first wafer 210 or the top surface of the second wafer 220. An inclined surface 251 processed by the grinding forms an angle θ, for example, of 60 degrees with respect to the bottom surface of the first wafer 210 or the top surface of the second wafer 220. Furthermore, the edge-trimmed inclined surface 251 is formed to a depth d3 from the top surface of the second wafer 220 and a flange portion 255 is left beyond the depth d3. The depth d3 is, for example, 210 µm.

As shown in FIG. 13A, the first wafer 210 and the second wafer 220 are bonded into the structure 200, which is edge trimmed to form the inclined surface 251 and then the first wafer 210 is ground from the top surface until a thickness d1 is achieved. The thickness d1 is 70 µm for example. The second wafer 220 is ground from the bottom surface until a thickness d2 is achieved. The thickness d2 is, for example, 110 µm. During this grinding process, the flange portion 255 is ground and removed.

The manufacturing method described above allows the structure 200 having the first wafer 210 and the second wafer 220 bonded with each other to be ground and edge trimmed from the periphery 205 to the ring-shaped sealing portion 203. Because the first wafer 210 and the second wafer 220 are supported by the sealing portion 203, the first wafer 210 and the second wafer 220 would not be broken when the first wafer 210 and the second wafer 220 are ground to be thinner.

Furthermore, according to the manufacturing method described above, the structure 200 having the first wafer 210 and the second wafer 220 bonded with each other includes the inclined surface 251 formed by edge trimming and having an angle θ, for example, 60 degrees, with respect to the bottom surface of the first wafer 210 or the top surface of the second wafer 220. Because the sealing portion 203 is exposed on the inclined surface 251, a seed layer for plating can be deposited continuously from the periphery 205 to the center of the first wafer 210 and the second wafer 220 along the inclined surface 251 with the resistance lowered.

Here, configuring the angle θ to be less than 90 degrees may allow the exposed area of the sealing portion 203 to be greater on the inclined surface 251 and may contribute to the lowered resistance. However, if the angle θ becomes too small, then the sealing portion 203 penetrates into the wafer and narrows the effective area 201 such that the number of the electronic devices to be diced out from the first wafer 210 and the second wafer 220 may decrease. Consequently, to prevent the decreased number of the diced electronic devices and ensure the lowered resistance of the seed layer for plating, the angle θ may be 60+/−20 degrees or 60+/−10 degrees.

Furthermore, according to the manufacturing method described above, the inclined surface 251 formed by edge trimming includes the sealing portion 203. Therefore, the sealing portion 203 can block water penetration into the cavity defined by the bottom surface of the first wafer 210 and the top surface of the second wafer 220 when the first wafer 210 and the second wafer 220 are ground to be thinner or are exposed to a wet process. Still furthermore, when the bottom surface of the second wafer 220 is ground, the flange portion 255 formed along the periphery 205 of the second wafer 220 can be simultaneously ground and removed.

Figure 13B:
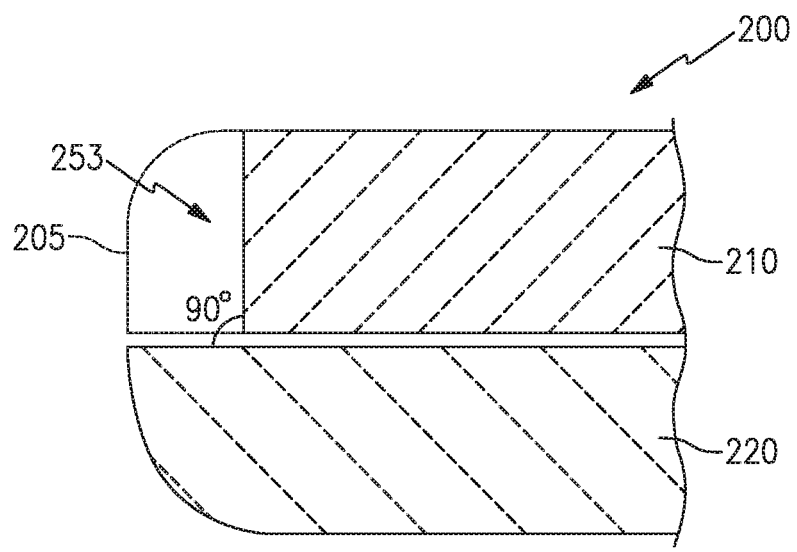

FIG. 13B is a cross-sectional view illustrating a state where the structure 200 of the first wafer 210 and the second wafer 220 bonded with each other is edge trimmed according to a conventional manufacturing method as a comparative example. The conventional manufacturing method grinds the first wafer 210 by edge trimming to form a vertical surface 253 having 90 degrees with respect to the bottom surface of the first wafer 210 or the top surface of the second wafer 220. The structure 200 of the first wafer 210 and the second wafer 220 bonded with each other and edge trimmed includes no sealing portion 203 between the bottom surface of the first wafer 210 and the top surface of the second wafer 220. Accordingly, the structure of the first wafer 210 and the second wafer 220 bonded with each other may allow water to penetrate into a gap between the bottom surface of the first wafer 210 and the top surface of the second wafer 220 when the top surface of the first wafer 210 or the bottom surface of the second wafer 220 is ground or exposed to a wet process.

Figure 14A:
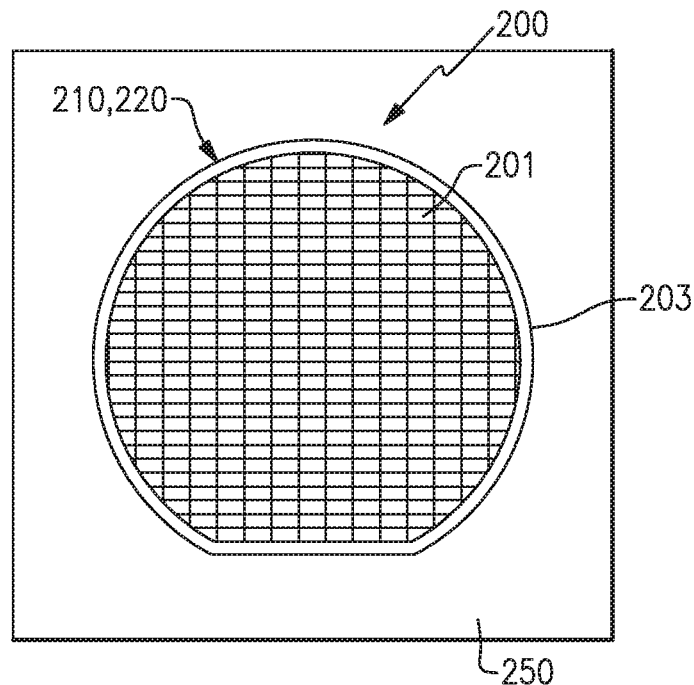
FIGS. 14A and 14B illustrate a method of manufacturing an electronic device according to embodiments described herein.
Figure 14B:
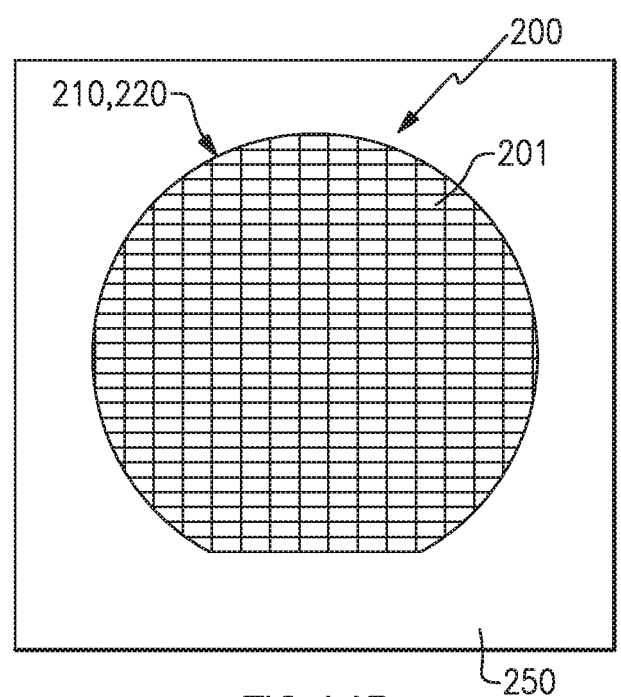

FIGS. 14A and 14B illustrate a method of manufacturing an electronic device according to a further aspect of the present disclosure. As shown in FIG. 14A, the structure 200 of the first wafer 210 and the second wafer 220 aligned and bonded with each other is adhered and secured onto a rear-surface grinding protection tape 250. Here, the structure 200 is configured as shown in FIG. 12A. Specifically, the first wafer 210 having a plurality of first substrates 10 arranged to form the electronic device 100 and the second wafer 220 having a plurality of second substrates 20 arranged to form the same electronic device 100 are aligned and bonded with each other. The first wafer 210 and the second wafer 220 are bonded with a ring-shaped sealing portion 203 along the periphery 205. The bonding may be performed by TLP bonding but another option can be used to achieve a suitable bonding. For example, an organic resin adhesive can be used.

According to the present disclosure, the structure 200 configured as the first wafer 210 and the second wafer 220 being bonded with the sealing portion 203 is diced into pieces into separated chips of the electronic devices 100 using a plasma dicing-before-grinding (DBG) technique. In particular, an effective area 201 where the chips of the electronic device 100 are formed in the structure 200 of the first wafer 210 and the second wafer 220 bonded with the sealing portion 203 is diced from the top surface of the first wafer 210 to a suitable depth by plasma. Then, the rear-surface grinding protection tape 250 is peeled away and another rear-surface grinding protection tape is adhered onto the top surface of the first wafer 210. Subsequently, the bottom surface of the second wafer 220 is ground to a suitable depth and the separated chips are formed. The rear-surface grinding protection tape is peeled away from the top surface to separate the structure 200 into pieces such that the electronic device 100 as a final product can be obtained.

According to an aspect of the present disclosure, the shapes of the first wafer 210 and the second wafer 220 can be maintained due to the rigidity of the ring-shaped sealing portion 203 even after the bottom surface of the second wafer 220 is ground. Therefore, the chips subject to grinding resistance during the grinding process can be prevented from moving such that the chips arranged adjacent to each other would not cause chipping and thus the chips of the electronic devices 100 can be separated without damage. Consequently, the width between the adjacent chips to be diced can be narrowed to maximize the number of chips obtained within the effective area 201.

FIG. 14B illustrates a conventional dicing process as comparative example. Conventionally, the structure 200 including the first wafer 210 and the second wafer 220 that are not secured by the sealing portion 203 along the periphery 205 is adhered onto the rear-surface grinding protection tape 250 and then the chips of the electronic devices 100 are diced out from the effective area 201. The wafer has been thinned by mechanical grinding and dicing techniques using a diamond wheel. Such conventional mechanical grinding and dicing techniques may cause chipping, chip cracking, and wafer cracking such that the yield and the productivity may be lowered.

Figure 15A:
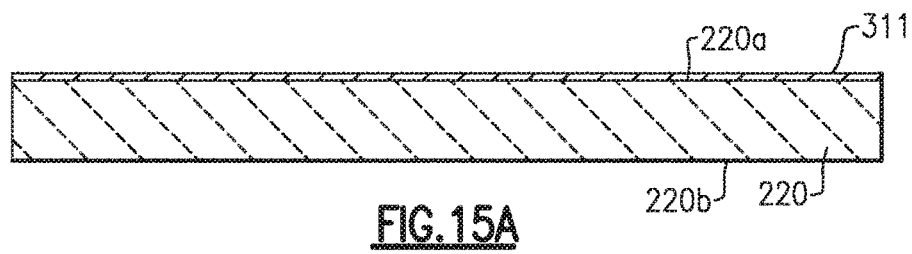
FIGS. 15A-15I are a first set of schematic views illustrating a series of steps of a method of manufacturing an electronic device.
Figure 15B:
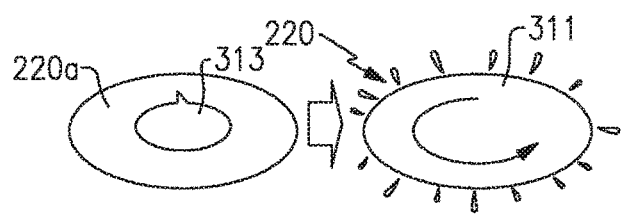
Figure 15C:
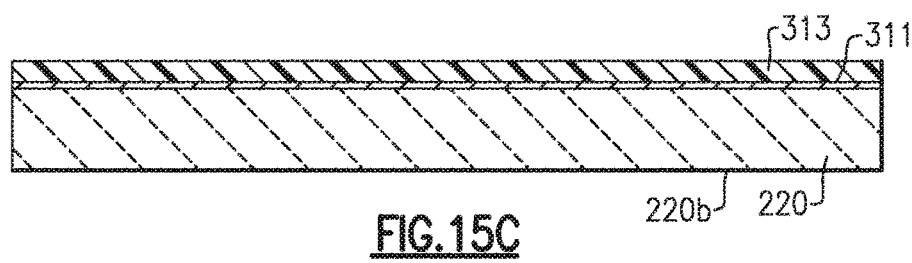
Figure 15D:
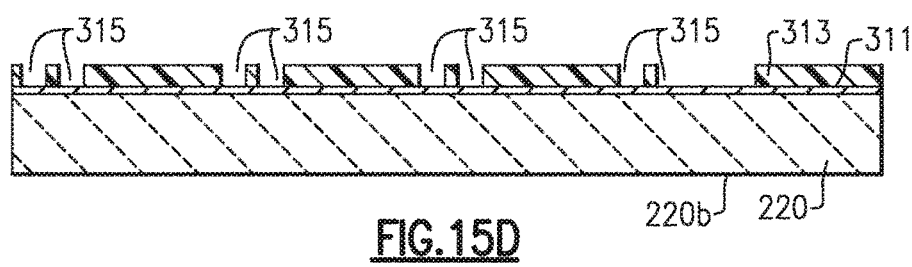
Figure 15E:
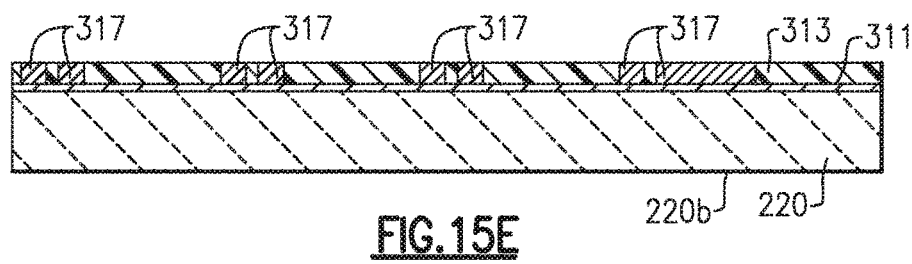
Figure 15F:
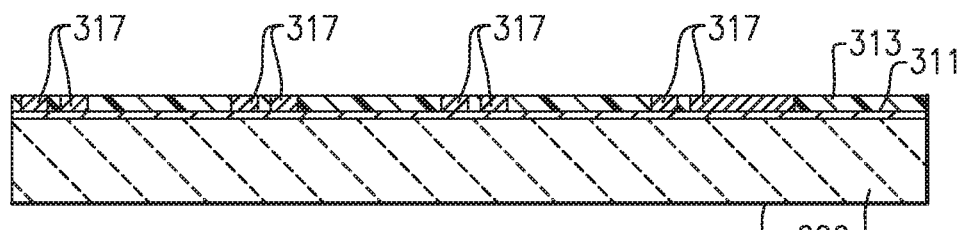
Figure 15G:
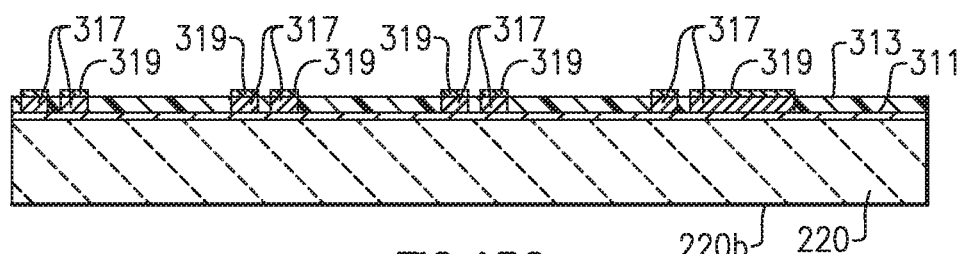
Figure 15H:
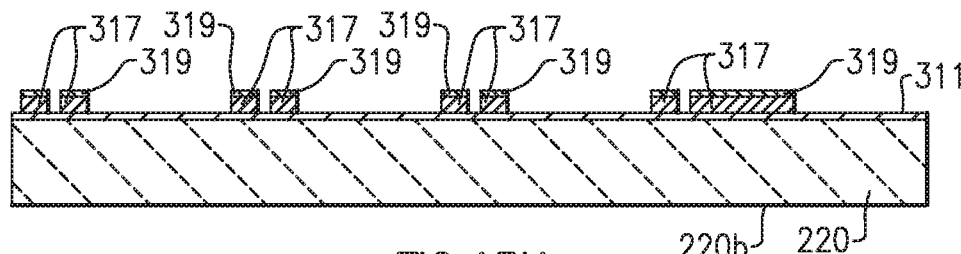
Figure 15I:
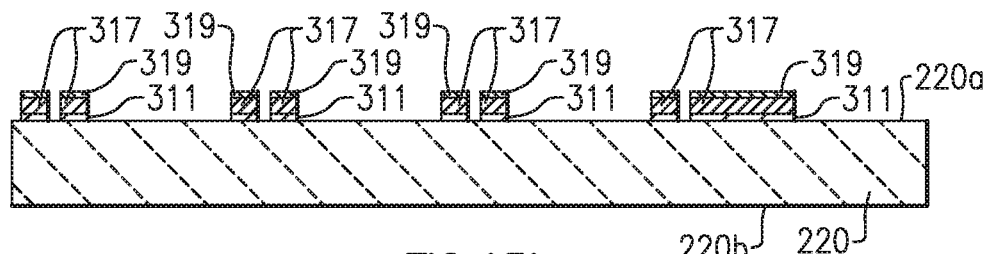

FIGS. 15A through 15I illustrate a series of steps of a method of manufacturing an electronic device according to aspects of the present disclosure. As shown in FIG. 15A, a second wafer 220 is prepared and a sputtered film 311 is formed on the top surface 220*a* of the second wafer 220. As shown in FIG. 15B, a resist 313 is applied by spin coating onto the sputtered film 311 formed on the second wafer 220. As shown in FIG. 15C, the second wafer 220 having the resist 313 applied is subject to exposure and a certain pattern is transferred. As shown in FIG. 15D, the exposed second wafer 220 is subject to post exposure bake (PEB) and development. Accordingly, a certain portion is removed from the resist 313 and a recess 315 is formed. As shown in FIG. 15E, a copper plating 317 is formed in the recess 315. As shown in FIG. 15F, the resist 313 and the copper plating 317 are ground to have a flattened surface. As shown in FIG. 15G, a tin plating 319 is applied onto the copper plating 317. As shown in FIG. 15H, the resist 313 is removed. As shown in FIG. 15I, the sputtered film 311 is further removed. As can be seen in FIG. 15I, a second metal layer made of copper as the second metal and a third metal layer made of tin as the third metal are sequentially stacked on the top surface 220*a* of the second wafer 220.

Figure 16A:
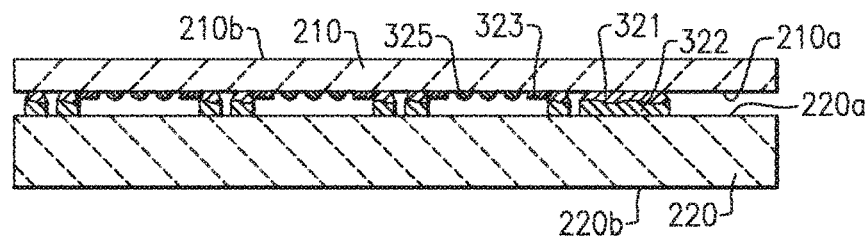
FIGS. 16A-16E are a second set of schematic views illustrating a series of steps of a method of manufacturing an electronic device.
Figure 16B:
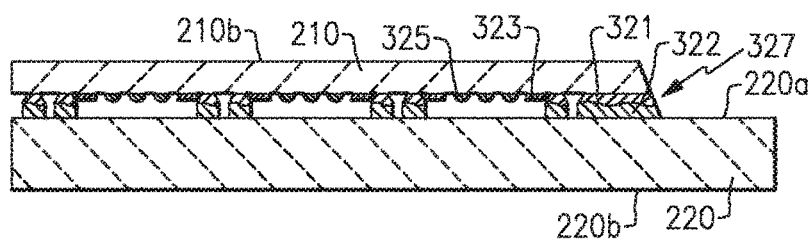
Figure 16C:
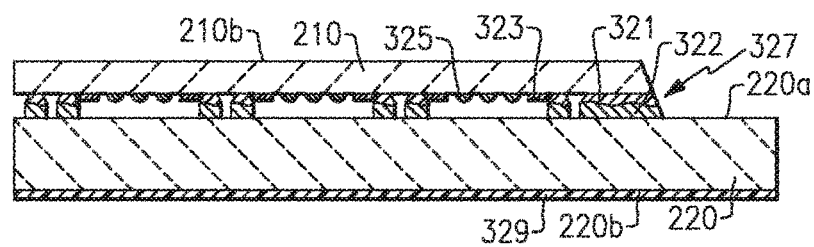
Figure 16D:
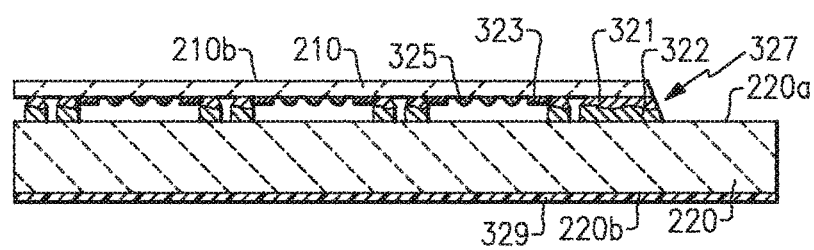
Figure 16E:
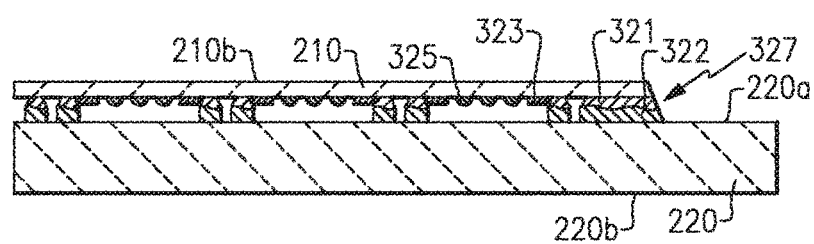

FIGS. 16A-16E illustrate a series of steps of a method of manufacturing an electronic device according to aspects of the present disclosure subsequent to the steps of FIGS. 15A-15I. As shown in FIG. 16A, a first wafer 210, which includes the film bulk acoustic resonator 325, the stop layer 323, and the first metal layer 36 (See FIGS. 3, 4) made of gold as the first metal suitably formed on the bottom surface 210*a,* is prepared and aligned with the second wafer 220 shown in FIG. 15I. Then, the second and third metal layers sequentially stacked on the top surface 220*a* of the second wafer 220 is bonded by TLP bonding with the first metal layer formed on the bottom surface 210*a* of the first wafer 210. Due to the bonding, a first alloy layer 321 made of gold-tin alloy and a second alloy layer 322 made of copper-tin alloy are sequentially stacked between the bottom surface 210*a* of the first wafer 210 and the top surface 220*a* of the second wafer 220. As shown in FIG. 16B, the first wafer 210 is ground along its periphery such that an inclined surface 327 on which the first alloy layer 321 and the second alloy layer 322 are exposed. As shown in FIG. 16C, a rear-surface grinding protection tape 329 is adhered onto the bottom surface 220*b* of the second wafer 220. As shown in FIG. 16D, the first wafer 210 is ground from the top surface 210*b* such that the first wafer 210 can have a certain thickness. As shown in FIG. 16E, the rear-surface grinding protection tape 329 is peeled away from the bottom surface 220*b* of the second wafer 220.

Figure 17A:
FIGS. 17A-17E are a third set of schematic views illustrating a series of steps of a method of manufacturing an electronic device.
Figure 17B:
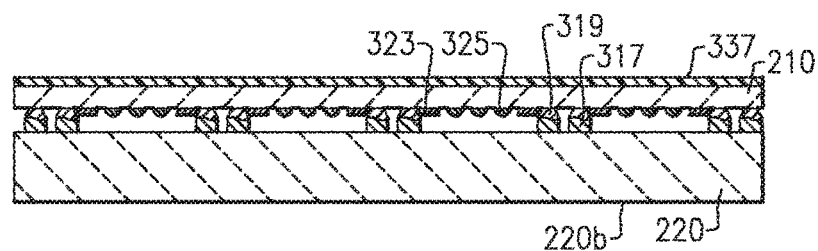
Figure 17C:
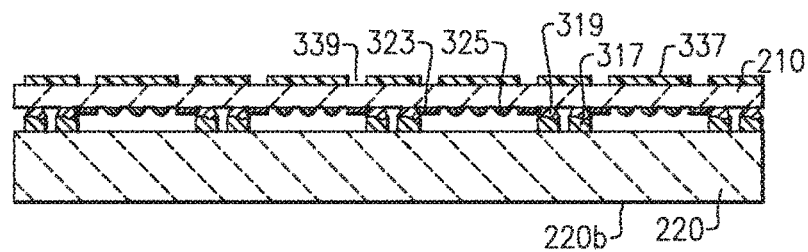
Figure 17D:
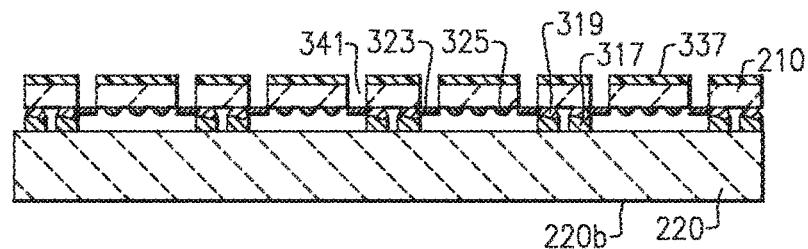
Figure 17E:
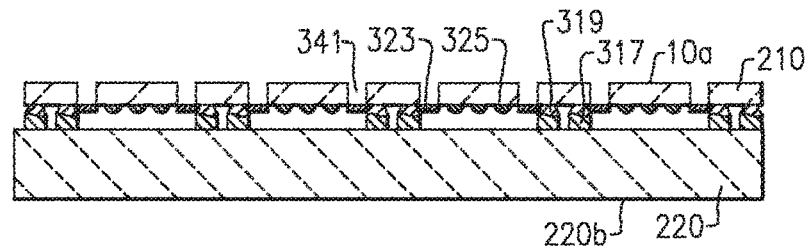

FIGS. 17A-17E illustrate a series of steps of a method of manufacturing an electronic device according to aspects of the present disclosure subsequent to the steps of FIGS. 16A-16E. As shown in FIG. 17A, a resist 337 is applied by spin coating onto the top surface 210*b* of the first wafer 210. As shown in FIG. 17B, the first wafer 210 having the resist 337 applied is subject to exposure and a certain pattern is transferred. As shown in FIG. 17C, the exposed first wafer 210 is subject to PEB and development. Accordingly, a certain portion is removed from the resist 337 and a recess 339 is formed. As shown in FIG. 17D, dry etching is performed through the recess 339 such that the first wafer 210 can be processed to have the top surface 210*b* communicating with the bottom surface 210*a* until a through-hole 341 is formed to reach the stop layer 323 formed on the bottom surface 210*a*. As shown in FIG. 17E, the resist 337 is removed.

Figure 18A:
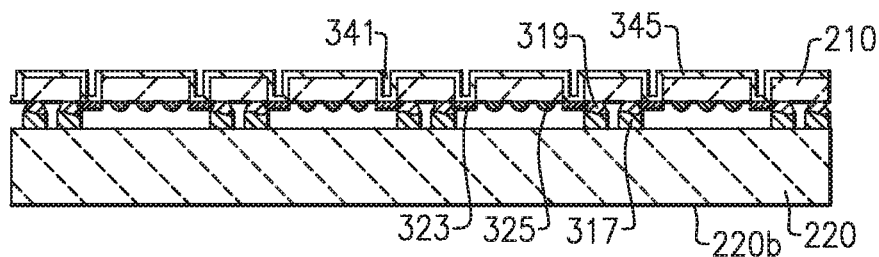
FIGS. 18A-18G are a fourth set of schematic views illustrating a series of steps of a method of manufacturing an electronic device.
Figure 18B:
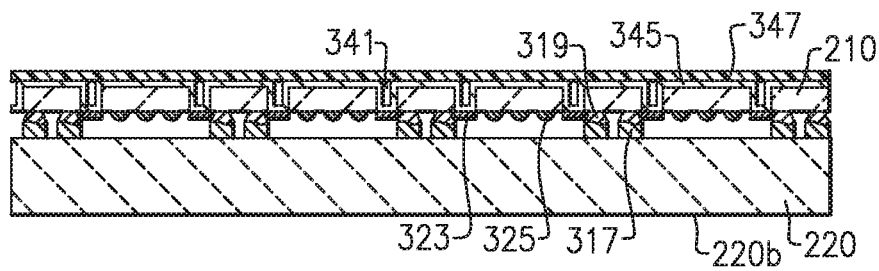
Figure 18C:
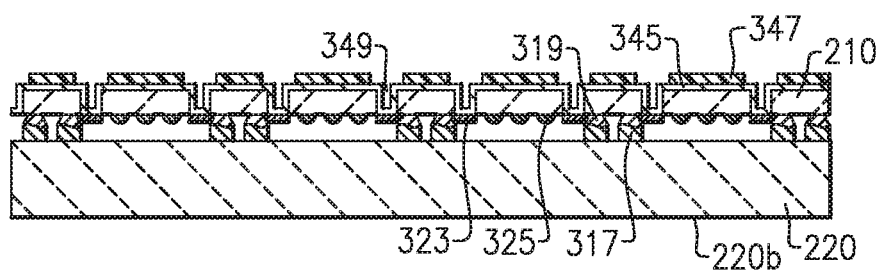
Figure 18D:
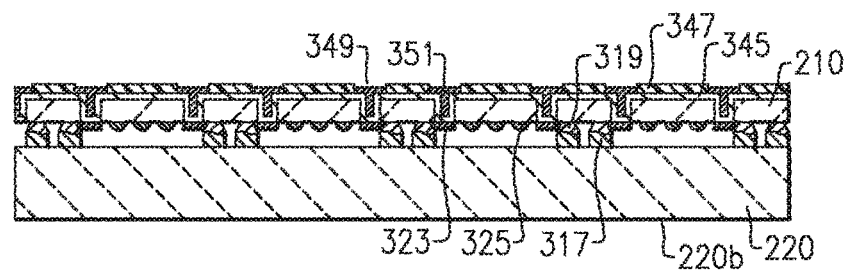
Figure 18E:
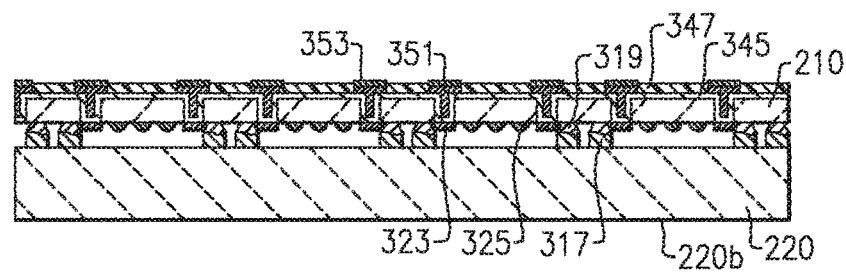
Figure 18F:
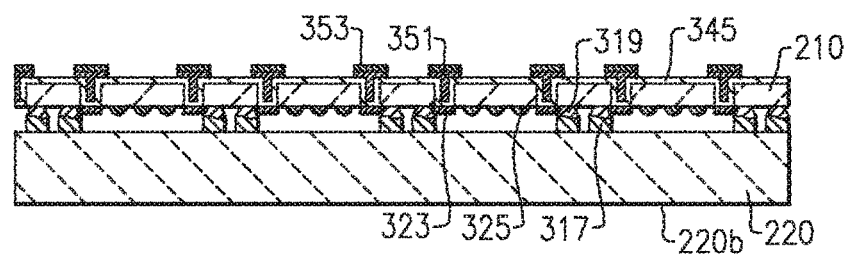
Figure 18G:
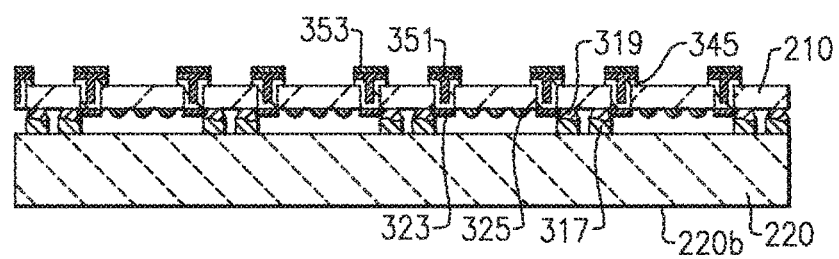

FIGS. 18A through 18G illustrate a series of steps of a method of manufacturing an electronic device according to an aspect of the present disclosure subsequent to the steps of FIGS. 17A-17E. As shown in FIG. 18A, a sputtered film 345 is formed to cover the top surface 210*b* of the first wafer 210 and the side and bottom surfaces of the through-hole 341. As shown in FIG. 18B, a resist 347 is applied by spin coating onto the top surface 210*b* of the first wafer 210 with the sputtered film 345 interposed. As shown in FIG. 18C, the resist 347 disposed on the top of the through-hole 341 is removed by exposure, PEB and development and a recess 349 is formed. As shown in FIG. 18D, a copper plating 351 is formed in the through-hole 341 and the recess 349. As shown in FIG. 18E, a solder plating 353 is applied onto the copper plating 351. As shown in FIG. 18F, the resist 347 is removed. As shown in FIG. 18G, the sputtered film 345 is removed.

Figure 19A:
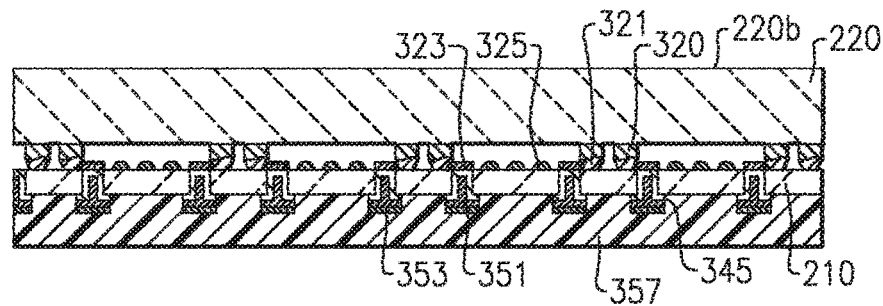
FIGS. 19A-19D are a fifth set of schematic views illustrating a series of steps of a method of manufacturing an electronic device.
Figure 19B:
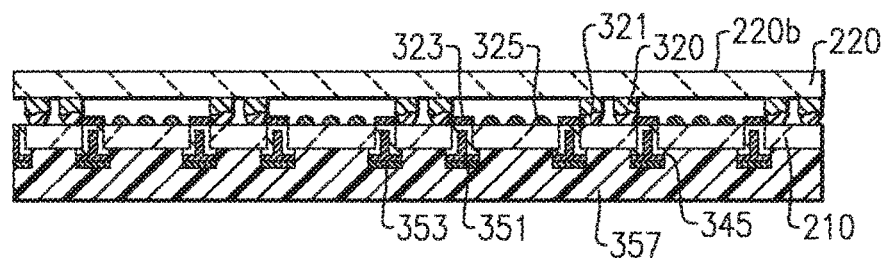
Figure 19C:
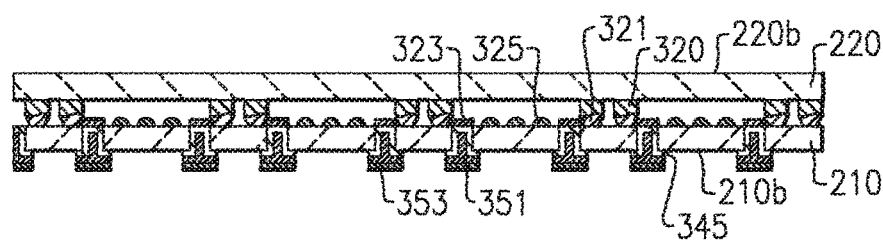
Figure 19D:
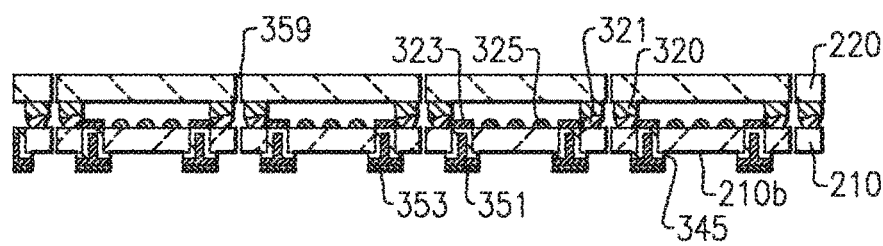

FIGS. 19A-19D illustrate a series of steps of a method of manufacturing an electronic device according to an aspect of the present disclosure subsequent to the steps of FIGS. 18A-18G. As shown in FIG. 19A, the first wafer 210 and the second wafer 220 are reversed upside down and a rear-surface grinding protection tape 357 is adhered onto the top surface 210*b* of the first wafer 210 that is now downside. As shown in FIG. 19B, the bottom surface 220*b* of the second wafer 220 that is now upside is ground until the second wafer 220 has a certain thickness. As shown in FIG. 19C, the rear-surface grinding protection tape 357 is peeled off from the top surface 210*b* of the first wafer 210 that is now downside. As shown in FIG. 19D, the structure 200 is diced by plasma DBG into separated chips of the electronic devices 100. Thus, the structure 200 is diced from the top surface 210*b* of the first wafer 210 to a suitable depth by plasma to form a gap 359. Subsequently, another rear-surface grinding protection tape is adhered onto the top surface 210*b* of the first wafer 210 and the bottom surface 220*b* of the second wafer 220 is ground to separate the chips of the electronic devices 100 into pieces.

Figure 20:
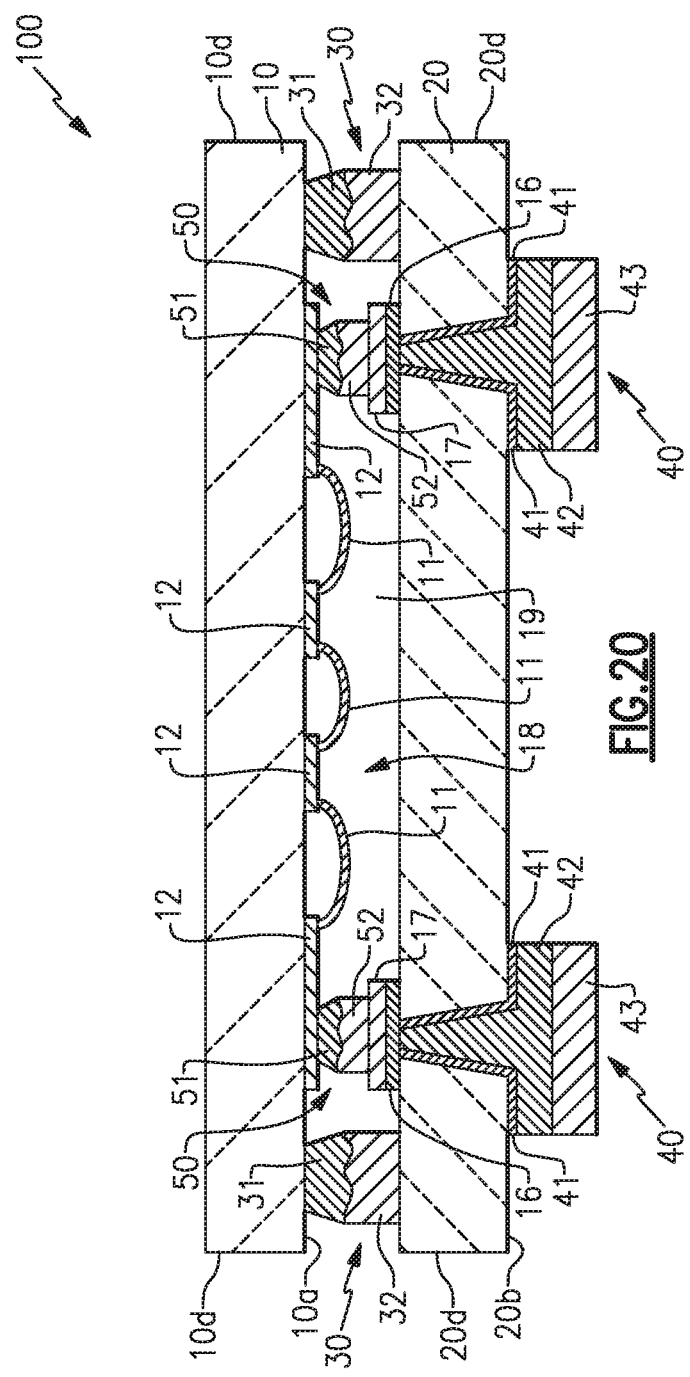
FIG. 20 is a cross-sectional view showing a schematic configuration of a first variation of an electronic device according to aspects of the present disclosure.
Figure 21:
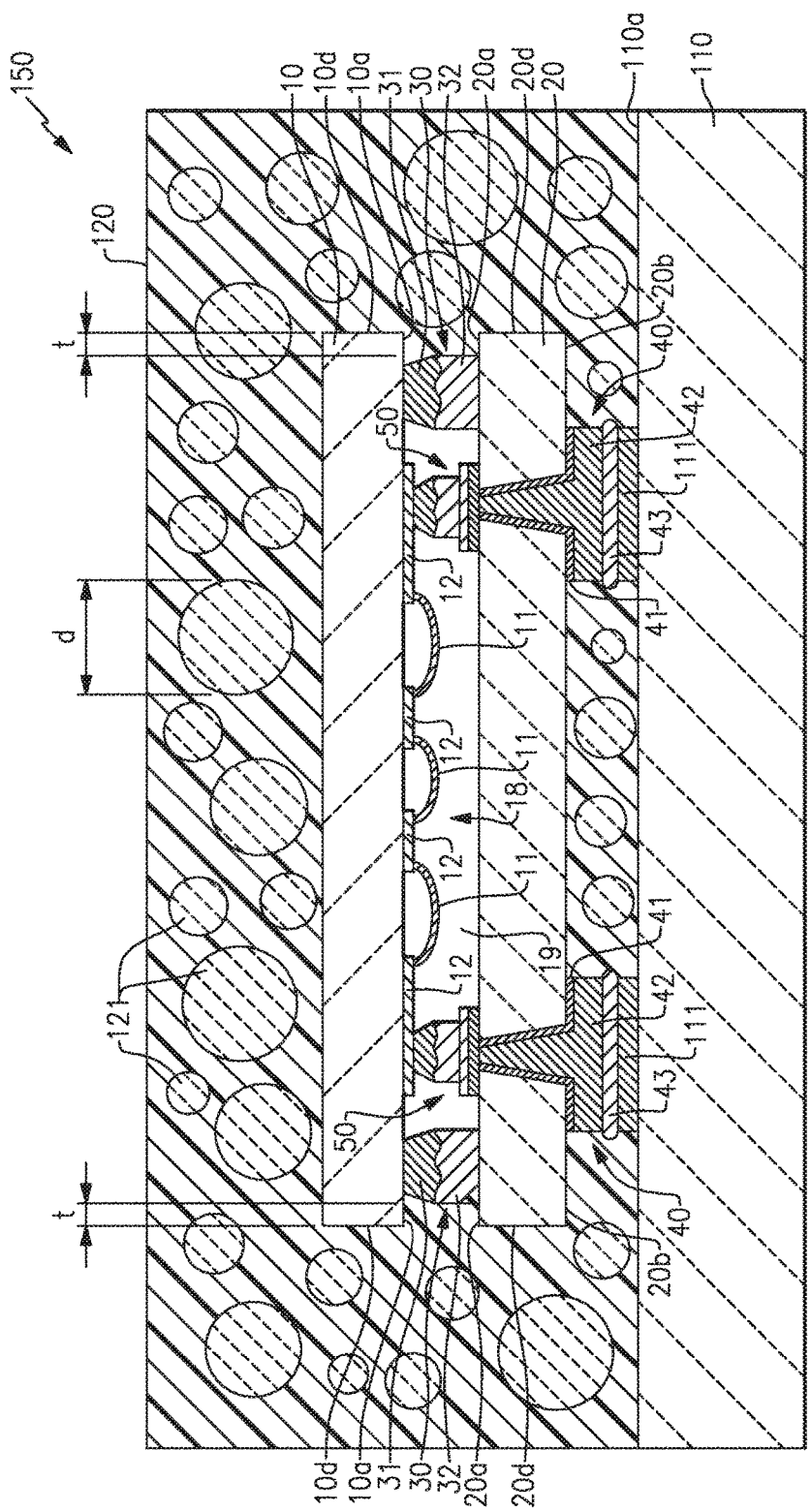
FIG. 21 is a cross-sectional view showing a structure in which an electronic device of the first variation is implemented on a printed circuit board.

FIG. 20 is a cross-sectional view showing a first variation of an electronic device according to a further aspect of the present disclosure. FIG. 21 is a cross-sectional view showing a structure in which an electronic device of the first variation is implemented on a printed circuit board. The first variation in which the external electrode 40 is disposed on the bottom surface 20*b* of the second substrate 20 is different from the electronic device of the embodiments previously described in which the external electrode 40 is disposed on the top surface 10*b* of the first substrate 10 as shown in FIG. 1. The other configurations of the first variation are similar to those of the electronic device of the previously described embodiments.

Figure 22:
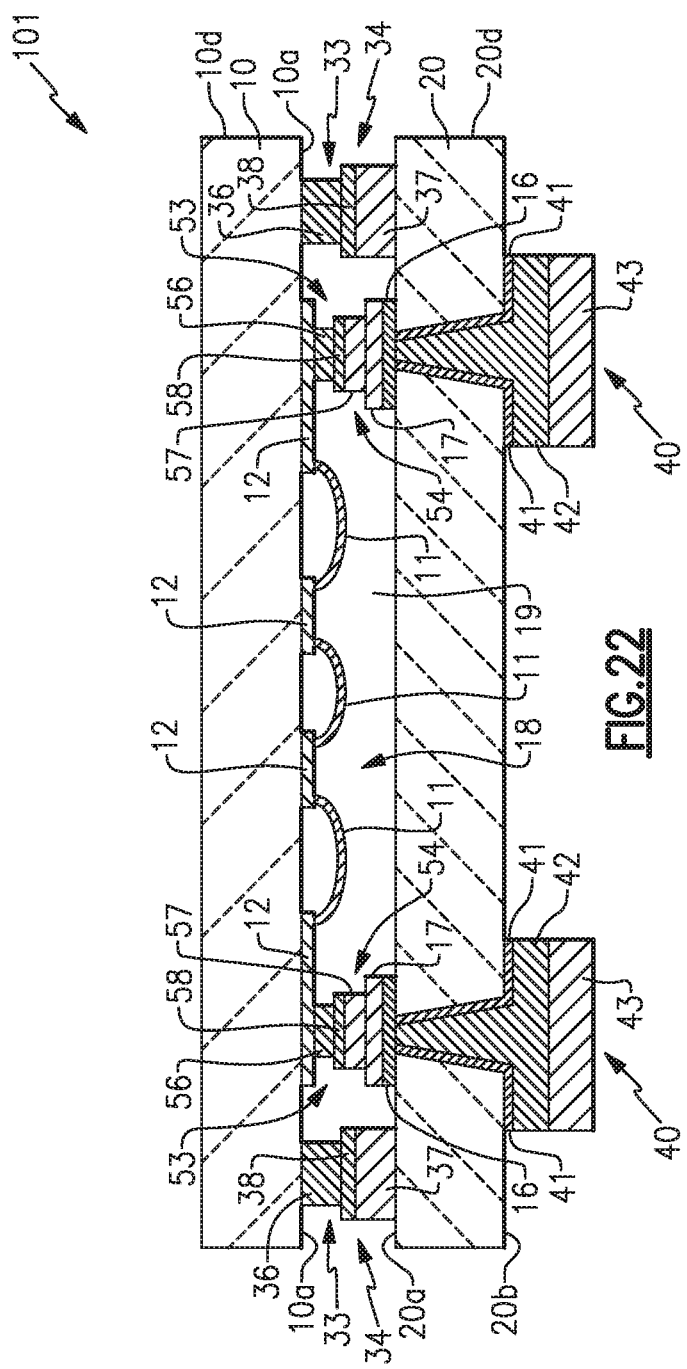
FIG. 22 is a cross-sectional view showing an alignment between a first substrate and a second substrate according to the first variation.

FIG. 22 is a cross-sectional view showing an alignment between the first substrate and the second substrate of the electronic device according to the first variation. Also in the first variation, similar to the electronic device shown in FIG. 3, the first substrate 10 is aligned with the second substrate 20 such that the bottom surface 10*a* of the first substrate 10, the top surface 20*a* of the second substrate 20, the first side wall 33 and the second side wall 34 can internally define a cavity 19 and the first side wall 33 can oppose and contact the second side wall 34. The first substrate 10 and the second substrate 20 are maintained in the aligned state and heated such that the first side wall 33 and the second side wall 34 are bonded with each other by TLP bonding into a single side wall 30.

The electronic circuit 18 illustrated in FIG. 1 and FIG. 2 that includes film bulk acoustic resonators 11 is disposed on the first substrate 10 whereas the external electrode 40 is disposed on the second substrate 20 in the electronic device of the first variation. Accordingly, the process of disposing the electronic circuit 18 on the first substrate 10 can be separated from the process of disposing the external electrode 40 on the second substrate 20 such that the respective substrates can be individually processed. Therefore, the number of steps for each process may be reduced and the processes can be easily performed on the first substrate 10 and the second substrate 20.

Figure 23:
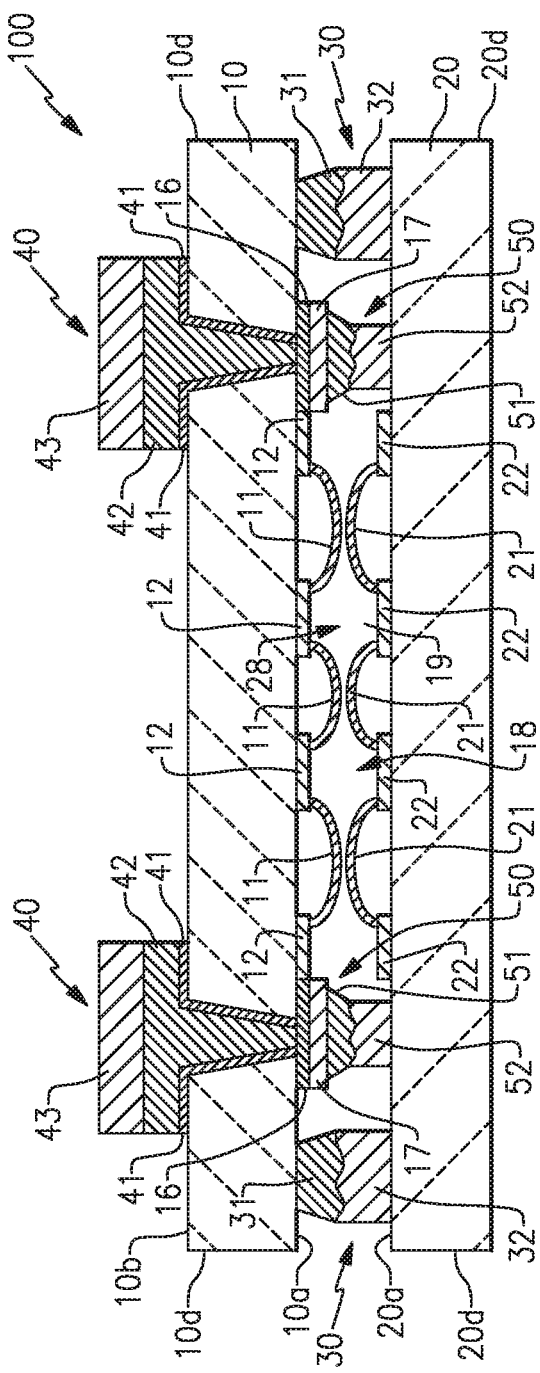
FIG. 23 is a cross-sectional view showing a schematic configuration of a second variation of an electronic device according to aspects of the present disclosure.

FIG. 23 is a cross-sectional view showing a second variation of an electronic device according to yet a further aspect of the present disclosure. In the second variation, an electronic circuit 28 including film bulk acoustic resonators 21 is disposed also on the top surface 20a of the second substrate 20 as compared to the electronic device 100 shown in FIG. 1. The electronic circuit 28 has the film bulk acoustic resonator 21 suitably connected to each other by wiring pads 22 and constitutes a filter, a filter device and the like with the electronic circuit 18 disposed on the bottom surface 10a of the first substrate 10. According to the second variation, the electronic circuit 28 is disposed also on the second substrate 20 such that the integration degree in the electronic device 100 can be improved to downsize the electronic device 100 and achieve high functionality.

Figure 24:
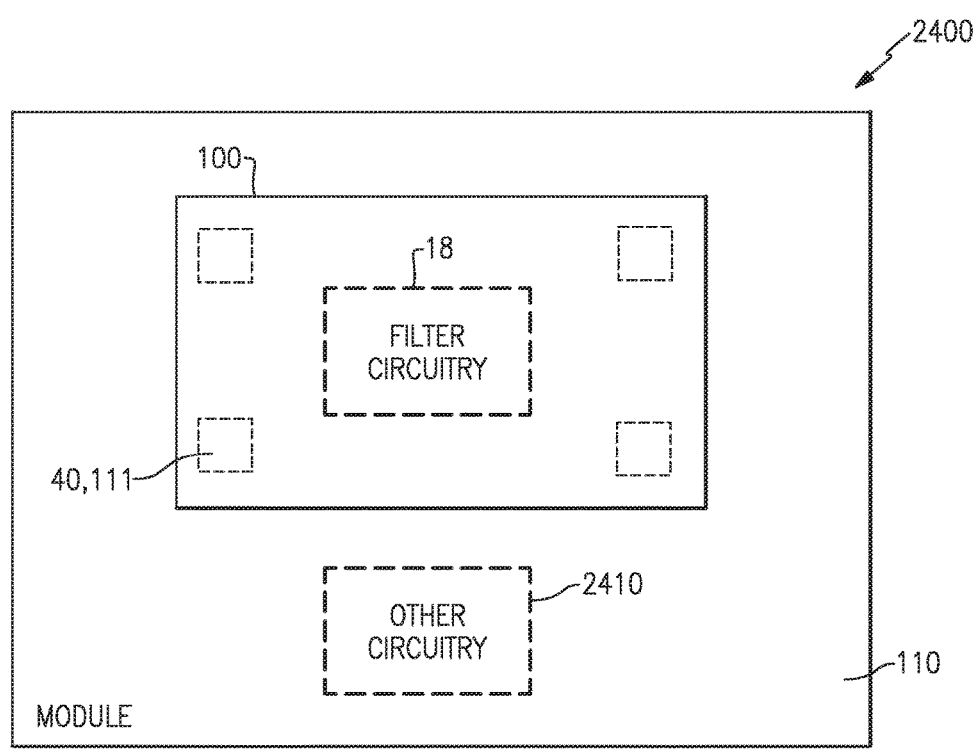
FIG. 24 is a block diagram of one example of a packaged module including filter circuitry according to various embodiments.

Embodiments of the filter circuitry 18 may be incorporated into and packaged as a module that may ultimately be used in an electronic device, such as a wireless communications device, for example. FIG. 24 is a block diagram illustrating one example of a module 2400 including the filter circuitry 18. The filter circuitry 18 may be implemented on one or more die(s) 100 including one or more connection pads, for example, external electrodes 40 as illustrated in FIG. 1. For example, the filter circuitry 18 may include a connection pad 40 that corresponds to an input contact for the filter circuitry 18 and another connection pad 40 that corresponds to an output contact for the filter circuitry 18. The packaged module 2400 includes a packaging substrate, for example, printed circuit board 110 as illustrated in FIG. 2 that is configured to receive a plurality of components, including the die 100. A plurality of connection pads, for example, electrodes 111 as illustrated in FIG. 2 can be disposed on the packaging substrate 110, and the various connection pads 40 of the filter circuitry 18 can be connected to the electrodes 111 on the packaging substrate 110 to allow for passing of various signals to and from the filter circuitry 18. Connection pads 40 and electrodes 111 are illustrated as overlapping in FIG. 24. The module 2400 may optionally further include other circuitry die 2410, such as, for example, one or more additional filter(s), amplifiers, pre-filters, modulators, demodulators, down converters, and the like, as would be known to one of skill in the art of semiconductor fabrication in view of the disclosure herein. In some embodiments, the module 2400 can also include one or more packaging structures to, for example, provide protection and facilitate easier handling of the module 2400. Such a packaging structure can include an overmold formed over the packaging substrate 110 and dimensioned to substantially encapsulate the various circuits and components thereon. The overmold may include, for example, resin 120 as illustrated in FIG. 2.

As discussed above, various examples and embodiments of the filter circuitry 18 can be used in a wide variety of electronic devices. For example, the filter circuitry 18 can be used in an antenna duplexer, which itself can be incorporated into a variety of electronic devices, such as RF front-end modules and communication devices.

Figure 25:
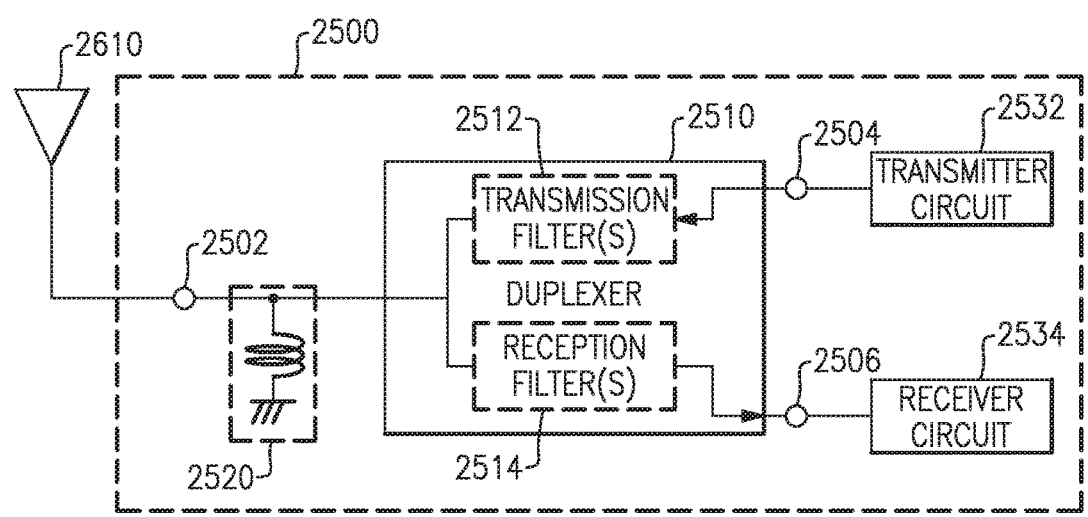
FIG. 25 is a block diagram of one example of a front-end module including an antenna duplexer implemented using examples of the filter circuitry according to certain embodiments.

Referring to FIG. 25, there is illustrated a block diagram of one example of a front-end module 2500, which may be used in an electronic device such as a wireless communications device (e.g., a mobile phone) for example. The front-end module 2500 includes an antenna duplexer 2510 having a common node 2502, an input node 2504, and an output node 2506. An antenna 2610 is connected to the common node 2502.

The antenna duplexer 2510 may include one or more transmission filters 2512 connected between the input node 2504 and the common node 2502, and one or more reception filters 2514 connected between the common node 2502 and the output node 2506. The passband(s) of the transmission filter(s) are different from the passband(s) of the reception filters. Embodiments of the filter circuit 18 may be included in the one or more transmission filters 2512 or the one or more reception filters 2514. An inductor or other matching component 2520 may be connected at the common node 2502.

The front-end module 2500 further includes a transmitter circuit 2532 connected to the input node 2504 of the duplexer 2510 and a receiver circuit 2534 connected to the output node 2506 of the duplexer 2510. The transmitter circuit 2532 can generate signals for transmission via the antenna 2610, and the receiver circuit 2534 can receive and process signals received via the antenna 2610. In some embodiments, the receiver and transmitter circuits are implemented as separate components, as shown in FIG. 25, however in other embodiments these components may be integrated into a common transceiver circuit or module. As will be appreciated by those skilled in the art, the front-end module 2500 may include other components that are not illustrated in FIG. 25 including, but not limited to, switches, electromagnetic couplers, amplifiers, processors, and the like.

Figure 26:
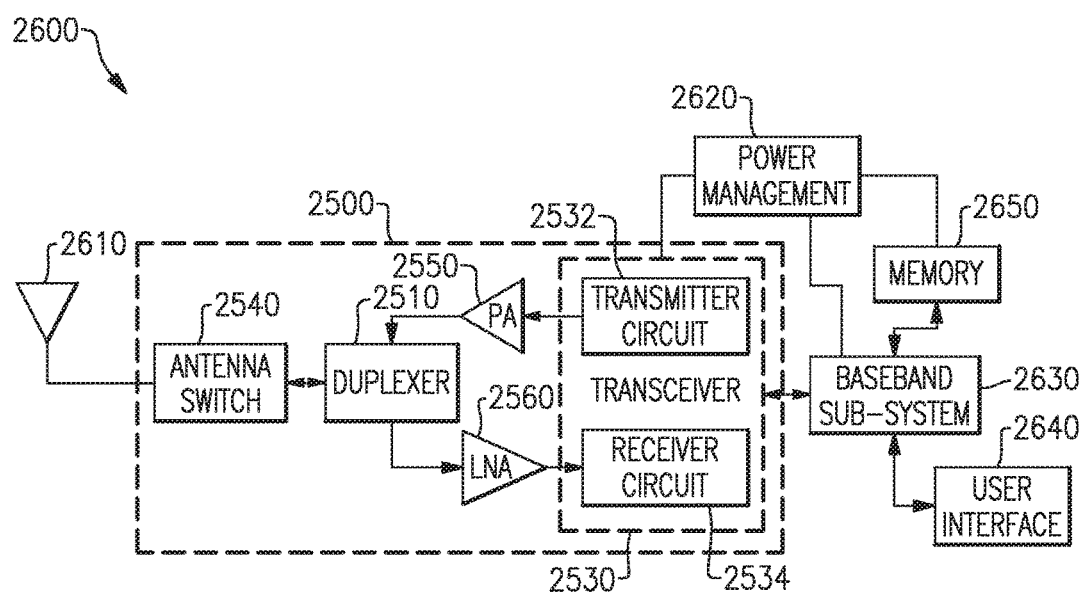
FIG. 26 is a block diagram of one example of a wireless device in which examples of the filter circuitry can be used according to various embodiments.

FIG. 26 is a block diagram of one example of a wireless device 2600 including the antenna duplexer 2510 shown in FIG. 25. The wireless device 2600 can be a cellular phone, smart phone, tablet, modem, communication network or any other portable or non-portable device configured for voice or data communication. The wireless device 2600 can receive and transmit signals from the antenna 2610. The wireless device includes an embodiment of a front-end module 2500 similar to that discussed above with reference to FIG. 25. The front-end module 2500 includes the duplexer 2510, as discussed above. In the example shown in FIG. 26 the front-end module 2500 further includes an antenna switch 2540, which can be configured to switch between different frequency bands or modes, such as transmit and receive modes, for example. In the example illustrated in FIG. 26, the antenna switch 2540 is positioned between the duplexer 2510 and the antenna 2610; however, in other examples the duplexer 2510 can be positioned between the antenna switch 2540 and the antenna 2610. In other examples the antenna switch 2540 and the duplexer 2510 can be integrated into a single component.

The front-end module 2500 includes a transceiver 2530 that is configured to generate signals for transmission or to process received signals. The transceiver 2530 can include the transmitter circuit 2532, which can be connected to the input node 2504 of the duplexer 2510, and the receiver circuit 2534, which can be connected to the output node 2506 of the duplexer 2510, as shown in the example of FIG. 25.

Signals generated for transmission by the transmitter circuit 2532 are received by a power amplifier (PA) module 2550, which amplifies the generated signals from the transceiver 2530. The power amplifier module 2550 can include one or more power amplifiers. The power amplifier module 2550 can be used to amplify a wide variety of RF or other frequency-band transmission signals. For example, the power amplifier module 2550 can receive an enable signal that can be used to pulse the output of the power amplifier to aid in transmitting a wireless local area network (WLAN) signal or any other suitable pulsed signal. The power amplifier module 2550 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 2550 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 26, the front-end module 2500 may further include a low noise amplifier module 2560, which amplifies received signals from the antenna 2610 and provides the amplified signals to the receiver circuit 2534 of the transceiver 2530.

The wireless device 2600 of FIG. 26 further includes a power management sub-system 2620 that is connected to the transceiver 2530 and manages the power for the operation of the wireless device 2600. The power management system 2620 can also control the operation of a baseband sub-system 2630 and various other components of the wireless device 2600. The power management system 2620 can include, or can be connected to, a battery (not shown) that supplies power for the various components of the wireless device 2600. The power management system 2620 can further include one or more processors or controllers that can control the transmission of signals, for example. In one embodiment, the baseband sub-system 2630 is connected to a user interface 2640 to facilitate various input and output of voice and/or data provided to and received from the user. The baseband sub-system 2630 can also be connected to memory 2650 that is configured to store data and/or instructions to facilitate the operation of the wireless device, and/or to provide storage of information for the user.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. It is to be appreciated that embodiments of the methods and apparatuses discussed herein are not limited in application to the details of construction and the arrangement of components set forth in the description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation Accordingly, the foregoing description and drawings are by way of example only, and the scope of the invention should be determined from proper construction of the appended claims, and their equivalents.

What is claimed is:

1. A method of manufacturing an electronic device, the method comprising:
  providing a first substrate having a first side wall formed along a periphery of a bottom surface of the first substrate, the first side wall surrounding an electronic circuit disposed on the bottom surface of the first substrate, the first side wall being formed of a first metal layer made of a first metal;
  providing a second substrate having a second side wall formed along a periphery of a top surface of the second substrate, the second side wall being formed of a second metal layer made of a second metal and a third metal layer made of a third metal sequentially stacked, the second metal and the third metal being different from each other and from the first metal;
  aligning the first substrate with the second substrate to internally define a cavity between the bottom surface of the first substrate, the top surface of the second substrate, the first side wall, and the second side wall, the first side wall opposing and contacting the second side wall; and
  heating the first substrate and the second substrate to bond the first side wall and the second side wall with each other by transient liquid phase bonding, the third metal layer being melted to form a first alloy layer and a second alloy layer with the first metal layer and the second metal layer respectively.

2. The method of claim 1 wherein providing the first substrate includes providing a substrate having a piezoelectric body, the electronic circuit including at least one of a film bulk acoustic resonator, a bulk acoustic wave element, a solidly mounted resonator, and a surface acoustic wave element.

3. The method of claim 1 wherein the third metal has a melting point lower than that of the second metal.

4. The method of claim 1 wherein the third metal layer is eliminated when the first alloy layer and the second alloy layer are formed.

5. The method of claim 1 further comprising forming the second side wall with a height greater than a height of the first side wall.

6. The method of claim 1 further comprising forming the second side wall with a width greater than a width of the first side wall.

7. The method of claim 1 wherein a starting temperature of alloy forming between the third metal layer and the second metal layer is lower than a starting temperature of alloy forming between the third metal layer and the first metal layer.

8. The method of claim 7 wherein there is no state where the first metal, the second metal, and the third metal are each concurrently melted during the transient liquid phase bonding.

9. The method of claim 1 wherein the first metal includes gold.

10. The method of claim 9 wherein the second metal includes copper.

11. The method of claim 9 wherein the third metal includes at least one of tin and indium.

12. The method of claim 1 wherein the first substrate has a thickness different from that of the second substrate.

13. The method of claim 1 further comprising forming a column between the bottom surface of the first substrate and the top surface of the second substrate within the cavity.

14. The method of 13 wherein forming the column comprises forming the column from a layer of the first alloy stacked on a layer of the second alloy.

15. The method of claim 14 wherein forming the column comprises forming the column with the layer of the first alloy being tapered.

16. The method of claim 1 further comprising forming a via through the first substrate, side surfaces of the via having a surface roughness greater than a surface roughness of the bottom surface of the first substrate.

17. The method of claim 16 wherein forming the via includes forming a first stop layer including a first metal on the bottom surface of the first substrate, forming a second stop layer including a second metal on the first stop layer, and etching the first substrate to form the via, etching of the first substrate terminating on one of the first stop layer and the second stop layer.

18. The method of claim 16 further comprising forming an external electrode including a first material layer having a portion passing through the via and an upwardly extending portion extending above an upper surface of the first substrate.

19. The method of claim 16 further comprising forming an electrical connection between the via and the electronic circuit.

20. The method of claims 16 further comprising forming a column coupled to the via and to the top surface of the second substrate.

21. The method of claim 1 wherein providing the first substrate includes providing the first substrate with a surface roughness of an upper surface of the first substrate greater than a surface roughness of the bottom surface of the first substrate.

22. The method of claim 1 wherein forming the first alloy layer comprises forming the first alloy layer with a tapered cross section.

23. The method of claim 1 further comprising bonding the first substrate and the second substrate to a top surface of a printed circuit board and covering the top surface of the printed circuit board with resin including a filler having particles with an average diameter, the first side wall and the second side wall being internally withdrawn from respective peripheries of the first substrate and the second substrate by a distance that is half or less of the average diameter of the particles of the filler.

\* \* \* \* \*

UNITED STATES PATENT AND TRADEMARK OFFICE
CERTIFICATE OF CORRECTION

| | | |
|---|---|---|
| PATENT NO. | : 10,439,587 B2 | Page 1 of 1 |
| APPLICATION NO. | : 15/828625 | |
| DATED | : October 8, 2019 | |
| INVENTOR(S) | : Atsushi Takano | |

It is certified that error appears in the above-identified patent and that said Letters Patent is hereby corrected as shown below:

On the Title Page

(72) Inventor: delete "Atsushi Takano, Kadoma (JP)" and insert -- Atsushi Takano, Kadoma-Shi (JP) --

Signed and Sealed this
Nineteenth Day of November, 2019

Andrei Iancu
*Director of the United States Patent and Trademark Office*